(12) United States Patent
Doi

(10) Patent No.: US 10,998,860 B2
(45) Date of Patent: May 4, 2021

(54) AMPLIFICATION APPARATUS AND AMPLIFICATION METHOD

(71) Applicant: NEC CORPORATION, Tokyo (JP)

(72) Inventor: Yoshiaki Doi, Tokyo (JP)

(73) Assignee: NEC CORPORATION, Tokyo (JP)

(*) Notice: Subject to any disclaimer, the term of this patent is extended or adjusted under 35 U.S.C. 154(b) by 55 days.

(21) Appl. No.: 16/495,589

(22) PCT Filed: Dec. 27, 2017

(86) PCT No.: PCT/JP2017/046885
§ 371 (c)(1),
(2) Date: Sep. 19, 2019

(87) PCT Pub. No.: WO2018/173407
PCT Pub. Date: Sep. 27, 2018

(65) Prior Publication Data
US 2020/0028473 A1    Jan. 23, 2020

(30) Foreign Application Priority Data

Mar. 21, 2017  (JP) .............................. JP2017-053943

(51) Int. Cl.
*H03F 1/07* (2006.01)
*H03F 1/02* (2006.01)
*H03F 1/26* (2006.01)

(52) U.S. Cl.
CPC ........... *H03F 1/0294* (2013.01); *H03F 1/025* (2013.01); *H03F 1/26* (2013.01)

(58) Field of Classification Search
CPC ................................. H03F 1/07; H03F 1/0288
(Continued)

(56) References Cited

U.S. PATENT DOCUMENTS

| 7,734,272 B2 * | 6/2010 | Kral ...................... H03D 3/008 455/333 |
| 2009/0163154 A1 | 6/2009 | Fonden et al. |
| 2010/0321107 A1 | 12/2010 | Honcharenko |

FOREIGN PATENT DOCUMENTS

| JP | 2003-152464 A | 5/2003 |
| JP | 2004-260707 A | 9/2004 |

(Continued)

OTHER PUBLICATIONS

Communication dated Jun. 16, 2020, from the Japanese Patent Office in Application No. 2019-506949.
(Continued)

*Primary Examiner* — Henry Choe

(57) ABSTRACT

In an amplification apparatus according to the present disclosure, a combining unit combines an output signal of a first amplifier provided at a first branch with an output signal of a second amplifier provided at a second branch and outputs the combined signal. A non-linearity compensation unit multiplies an input baseband signal by a non-linearity compensation coefficient for compensating non-linearity of the entire apparatus, a first deviation compensation unit multiplies a first branch signal by a first deviation compensation coefficient for compensating an inter-branch deviation, and a second deviation compensation unit multiplies a second branch signal by a second deviation compensation coefficient for compensating the inter-branch deviation. A compensation coefficient calculation unit calculates the non-linearity compensation coefficient, the first deviation compensation coefficient, and the second deviation compensation coefficient based on the input baseband signal and a feedback baseband signal obtained by feeding back the combined signal.

8 Claims, 14 Drawing Sheets

(58) Field of Classification Search
USPC .............................................. 330/124 R, 295
See application file for complete search history.

(56) References Cited

FOREIGN PATENT DOCUMENTS

| JP | 2005-101940 A | 4/2005 |
|----|---------------|--------|
| JP | 2014-011653 A | 1/2014 |
| JP | 2015-146529 A | 8/2015 |
| JP | 5906967 B2    | 4/2016 |
| JP | 2016-127577 A | 7/2016 |

OTHER PUBLICATIONS

Frederick H. Raab, "Efficiency of Outphasing RF Power-Amplifier Systems", IEEE Transactions on Communications, Oct. 1985, pp. 1094-1099, vol. COM-33, No. 10.

Jawad H. Qureshi et al., "A 90-W Peak Power GaN Outphasing Amplifier With Optimum Input Signal Conditioning", IEEE Transactions on Microwave Theory and Techniques, Aug. 2009, pp. 1925-1935, vol. 57, No. 8.

International Search Report for PCT/JP2017/046885 dated Mar. 27, 2018 [PCT/ISA/210].

\* cited by examiner $|S_1(t)| = |-S_2(t)|$

AMPLIFICATION APPARATUS AND AMPLIFICATION METHOD

CROSS REFERENCE TO RELATED APPLICATIONS

This application is a National Stage of International Application No. PCT/JP2017/046885 filed Dec. 27, 2017, claiming priority based on Japanese Patent Application No. 2017-053943 filed on Mar. 21, 2017, the entire contents of which are incorporated by reference.

TECHNICAL FIELD

The present disclosure relates to a technique for improving efficiency of a transmission apparatus such as a base station used in a radio communication system. In particular, the present disclosure relates to a technique for improving efficiency of an amplification apparatus, and a control technique therefor.

BACKGROUND ART

In related art, an outphasing type amplification apparatus (hereinafter referred to as an outphasing amplification apparatus) has been proposed as a high efficiency amplification apparatus that operates an amplifier in an output saturation region (see, for example, Non Patent Literature 1).

The outphasing amplification apparatus is a linear amplification apparatus using a constant amplitude amplifier such as a saturation amplifier like an amplification apparatus of LINC (Linear Amplification with Nonlinear Components) type. However, the LINC type amplification apparatus uses, for example, a hybrid or 3 dB coupler which causes a loss of 3 dB at the time of combining signals as a combining unit that combines output signals of the two amplifiers. On the other hand, the outphasing amplification apparatus uses a Chireix Combiner that combines output signals of two amplifiers without isolation. Thus, the outphasing amplification apparatus can reduce the loss at the time of combining signals, thereby reducing the linearity and instead improving the efficiency.

In the outphasing amplification apparatus according to the related art, input impedances of respective input ports of the Chireix combiner viewed from the two amplifiers are asymmetrical. This leads to a problem that a dynamic range of an amplitude (output power) of an outphasing combined signal, which is an output signal of the Chireix combiner, becomes narrow. This is because of an amplitude imbalance of output signals of the respective amplifiers caused by the above asymmetric input impedance, which reduces an amount of cancellation of the amplitude of the outphasing combined signal when a phase difference of input signals to the Chireix combiner from the two amplifiers is increased to control the amplitude of the outphasing combined signal to be small in an outphasing control operation.

FIG. 12 is a block diagram showing an example of a configuration of the outphasing amplification apparatus according to the related art. The example of FIG. 12 is described in FIG. 1 of Patent Literature 1 and FIG. 9 of Non Patent Literature 2.

As shown in FIG. 12, the outphasing amplification apparatus according to the related art includes a signal separation unit 2, a DAC+Filter (digital-to-analog converter and filter) 3a, a quadrature modulator 4a, a frequency converter 5a, and a first amplifier 6a (amplifier A). The outphasing amplification apparatus according to the related art further includes a DAC+Filter (digital-to-analog converter and filter) 3b, a quadrature modulator 4b, a frequency converter 5b, and a second amplifier 6b (amplifier B). Furthermore, the outphasing amplification apparatus according to the related art includes a combining unit 7, a frequency converter 8, a quadrature demodulator 9, a Filter+ADC (filter and analog-to-digital converter) 10, a non-linearity compensation unit 1, and a compensation coefficient calculation unit 11.

The non-linearity compensation unit 1 performs non-linearity compensation processing on an input baseband signal $S_{in}(t)$ input to the outphasing amplification apparatus, and outputs, to the signal separation unit 2, the signal subjected to the non-linearity compensation processing as $S_{pd}(t)$. The non-linearity compensation processing is processing for previously multiplying the input baseband signal $S_{in}(t)$ that is not yet amplified by the outphasing amplification apparatus by a non-linearity compensation coefficient. The non-linearity compensation coefficient will be described later.

The signal separation unit 2 performs phase modulation on the output signal $S_{pd}(t)$ of the non-linearity compensation unit 1 according to an amplitude of $S_{pd}(t)$, separates it into $S_{C1}(t)$ and $S_{C2}(t)$, which are phase modulated pair signals of a constant amplitude, and outputs $S_{C1}(t)$ to the DAC+Filter 3a and $S_{C2}(t)$ to the DAC+Filter 3b. The DAC+Filter 3a converts one of the phase modulated pair signals, which is $S_{C1}(t)$, from a digital signal into an analog signal, and outputs the converted signal to the quadrature modulator 4a. The DAC+Filter 3b converts the other one of the phase modulated pair signals, which is $S_{C2}(t)$, from a digital signal to an analog signal, and outputs the converted signal to the quadrature modulator 4b.

The quadrature modulator 4a quadrature-modulates an in-phase (I-phase) signal and a quadrature (Q-phase) signal, which are output signals of the DAC+Filter 3a, and outputs the quadrature-modulated signals to the frequency converter 5a. The quadrature modulator 4b quadrature-modulates an in-phase (I-phase) signal and a quadrature (Q-phase) signal, which are output signals of the DAC+filter 3b, and outputs the quadrature-modulated signals to the frequency converter 5b.

The frequency converter 5a uses a local oscillation signal (not shown) to convert the output signal of the quadrature modulator 4a from a signal of a baseband frequency or an Intermediate Frequency (IF) into a Radio Frequency (RF) signal and outputs the converted signal to the first amplifier 6a. The frequency converter 5b uses a local oscillation signal (not shown) to convert the output signal of the quadrature modulator 4b from a signal of a baseband frequency or an intermediate frequency into a radio frequency signal and outputs the converted signal to the second amplifier 6b.

When the quadrature modulator 4a and the quadrature modulator 4b have a function capable of directly converting an input in-phase (I-phase) signal and a quadrature (Q-phase) signal into radio frequency signals, the frequency converter 5a and the frequency converter 5b become unnecessary.

The first amplifier 6a amplifies the power of the output signal of the frequency converter 5a, and outputs the signal with amplified power to the combining unit 7 as $S_1(t)$. The second amplifier 6b amplifies the power of the output signal of the frequency converter 5b, and outputs the signal with amplified power to the combining unit 7 as $S_2(t)$.

The combining unit 7 is a Chireix combiner that combines the output signal of the first amplifier 6a with the output signal of the second amplifier 6b and outputs the combined signal as an outphasing combined signal $S_{out}(t)$. This outphasing combined signal $S_{out}(t)$ is output from the outphasing amplification apparatus and transmitted from an antenna or the like (not shown).

The frequency converter 8 uses a local oscillation signal (not shown) to convert the outphasing combined signal $S_{out}(t)$, which is the output signal of the combining unit 7, from the radio frequency signal into the signal of the baseband frequency or the intermediate frequency and outputs the converted signal to the quadrature demodulator 9. The quadrature demodulator 9 demodulates the output signal of the frequency converter 8 into an in-phase (I-phase) signal and a quadrature (Q-phase) signal, and outputs the demodulated signal to the Filter+ADC 10. The Filter+ADC 10 converts the output signal of the quadrature demodulator 9 from an analog signal into a digital signal, and outputs the converted signal to the compensation coefficient calculation unit 11 as a feedback baseband signal $S_{fb}(t)$.

When the quadrature demodulator 9 has a function capable of directly converting an input radio frequency signal into an in-phase (I-phase) signal and a quadrature (Q-phase) signal, the frequency converter 8 becomes unnecessary.

The compensation coefficient calculation unit 11 compares the input baseband signal $S_{in}(t)$ with the feedback baseband signal $S_{fb}(t)$, calculates the non-linearity compensation coefficient for compensating the non-linearity, as an entire apparatus, of the outphasing combined signal $S_{out}(t)$, which is the output signal of the combining unit 7, and outputs the calculated non-linearity compensation coefficient to the non-linearity compensation unit 1.

In the above non-linearity compensation processing, the non-linearity compensation unit 1 multiplies the input baseband modulated signal $S_{in}(t)$ by the non-linearity compensation coefficient calculated by the compensation coefficient calculation unit 11.

Next, the outphasing control operation will be described.

In this example, it is assumed that the non-linearity compensation unit 1 in FIG. 12 is not operated in order to simplify the description of the outphasing control operation.

Since the output signal $S_{pd}(t)$ of the non-linearity compensation unit 1 is the same as $S_{in}(t)$ when the non-linearity compensation unit 1 is not operated, the input signal of the signal separation unit 2 is represented by $S_{in}(t)$ in the following formula (1).

[Formula 1]

$$S_{in}(t)=|S_{in}(t)|\cdot(\cos\theta(t)+j\sin\theta(t)). \quad (1)$$

In Formula (1), $|S_{in}(t)|$ is an amplitude modulation component of $S_{in}(t)$, and $\theta(t)$ is a phase modulation component of $S_{in}(t)$.

In the outphasing control using the Chireix combiner (combining unit 7), the phase modulation angle $\varphi_m(t)$ according to the amplitude of the input baseband signal $S_{in}(t)$ can be expressed, for example, by Formula (2).

[Formula 2]

$$\phi_m(t) = \sin^{-1}\left[\frac{|S_{in}(t)|}{|S_{in}|_{pk}}\right] \quad 0 \le \phi_m(t) \le \frac{\pi}{2} [\text{radian}] \quad (2)$$

In Formula (2), $|S_{in}|_{pk}$ is a maximum value of $|S_{in}(t)|$. A value of $|S_{in}|_{pk}$ is determined by a relationship between a Peak to Average Power Ratio (PAPR) of the input baseband signal $S_{in}(t)$ and a saturation output level of the amplifiers 6a and 6b and then set.

The relationship between the input baseband signal $S_{in}(t)$ and the phase modulated pair signals $S_{C1}(t)$ and $S_{C2}(t)$ in the outphasing control using the Chireix combiner (combining unit 7) is expressed by Formula (3).

[Formula 3]

$$S_{in}(t)=S_{C1}(t)-S_{C2}(t) \quad (3)$$

From Formulas (1), (2), and (3), the phase modulated pair signals $S_{C1}(t)$ and $S_{C2}(t)$ of the constant amplitude can be expressed by the following Formulas (4) and (5).

[Formula 4]

$$\begin{aligned} S_{C1}(t) &= \frac{|S_{in}|_{pk}}{2} \cdot [\cos\theta(t) + j\sin\theta(t)] \cdot [\sin(\phi_m(t)) - j\cos(\phi_m(t))] \\ &= \frac{|S_{in}|_{pk}}{2} \cdot [\cos\theta(t) + j\sin\theta(t)] \cdot \\ &\quad \left[\cos\left(\frac{\pi}{2} - \phi_m(t)\right) - j\sin\left(\frac{\pi}{2} - \phi_m(t)\right)\right] \\ &= \frac{|S_{in}|_{pk}}{2} \cdot \left[\cos\left(\theta(t) - \left(\frac{\pi}{2} - \phi_m(t)\right)\right) + \right. \\ &\quad \left. j\sin\left(\theta(t) - \left(\frac{\pi}{2} - \phi_m(t)\right)\right)\right] \end{aligned} \quad (4)$$

[Formula 5]

$$\begin{aligned} S_{C2}(t) &= \frac{|S_{in}|_{pk}}{2} \cdot [\cos\theta(t) + j\sin\theta(t)] \cdot \\ &\quad [-\sin(\phi_m(t)) - j\cos(\phi_m(t))] \\ &= \frac{|S_{in}|_{pk}}{2} \cdot [\cos\theta(t) + j\sin\theta(t)] \cdot \\ &\quad \left[\cos\left(\frac{\pi}{2} + \phi_m(t)\right) - j\sin\left(\frac{\pi}{2} + \phi_m(t)\right)\right] \\ &= \frac{|S_{in}|_{pk}}{2} \cdot \left[\cos\left(\theta(t) - \left(\frac{\pi}{2} + \phi_m(t)\right)\right) + \right. \\ &\quad \left. j\sin\left(\theta(t) - \left(\frac{\pi}{2} + \phi_m(t)\right)\right)\right] \end{aligned} \quad (5)$$

FIG. 13 shows the relationship between the input baseband signal $S_{in}(t)$ and the phase modulated pair signals $S_{C1}(t)$ and $S_{C2}(t)$ (and $-S_{C2}(t)$) in the outphasing control using the Chireix combiner (combining unit 7). In FIG. 13, a baseband phase $\theta(t)$ of the input baseband signal $S_{in}(t)$ is used as a reference (replaced with zero) to simplify the drawing. Note that, although the signals that are actually phase-modulated by the signal separation unit 2 are $S_{C1}(t)$ and $S_{C2}(t)$, the phase of $S_{C2}(t)$ is inverted finally in the case of using the Chireix combiner (combining unit 7). Thus, $-S_{C2}(t)$ is also shown in FIG. 13 to help understanding the drawing.

In this manner, as shown in Formulas (1) to (5) and in FIG. 13, the signal separation unit 2 generates the phase modulated pair signals $S_{C1}(t)$ and $-S_{C2}(t)$ of the constant amplitude provided with phase modulation control of $\pm\varphi_m(t)$ in such a way that the phases of $S_{C1}(t)$ and $-S_{C2}(t)$ become $\pm|\pi/2-\varphi_m(t)|$ with respect to the phase of the input baseband signal $S_{in}(t)$ according to the amplitude of the input baseband signal $S_{in}(t)$, i.e., in such a way that a phase difference of $2\times|\pi/2-\varphi_m(t)|$ is generated between the signals $S_{C1}(t)$ and $-S_{C2}(t)$.

One of the above phase modulated pair signals of the constant amplitude generated by the signal separation unit 2, which is $S_{C1}(t)$, is converted into a radio frequency signal and amplified by the DAC+Filter 3a, the quadrature modulator 4a, the frequency converter 5a, and the first amplifier 6a, and then input to one of the input ports of the combining unit 7 as the signal $S_1(t)$. The other one of the above phase modulated pair signals, which is $S_{C2}(t)$, is converted into a radio frequency signal and amplified by the DAC+Filter 3b, the quadrature modulator 4b, the frequency converter 5b, and the second amplifier 6b, and then input to the other one of the input ports of the combining unit 7 as the signal $S_2(t)$. When the radio frequency is represented by $f_C$, and $\omega_C=2\pi f_C$ holds, the signals $S_1(t)$ and $S_2(t)$ at the respective input ports of the combining unit 7 correspond to the ones in the above Formulas (4) and (5) where $\theta(t)$ is replaced by $[\omega_C(t)+\theta(t)]$, and the gains of the amplifiers 6a and 6b are multiplied by G.

Further, as described in Non Patent Literature 1, as for the signals $S_1(t)$ and $S_2(t)$ at the respective input ports of the combining unit 7, when the Chireix combiner is used as the combining unit 7, the phase of $S_2(t)$ is inverted ($-S_{C2}(t)$) and combined with $S_1(t)$. Thus, the outphasing combined signal $S_{out}(t)$, which is the output signal of the combining unit 7, can be expressed by Formula (6).

[Formula 6]

$$S_{out}(t) = S_1(t) + (-S_2(t)) \quad (6)$$
$$= \frac{|S_{in}|_{pk}}{2} \cdot [\cos(\omega_C(t) + \theta(t)) + j\sin(\omega_C(t) + \theta(t))] \cdot$$
$$[2 \cdot \sin(\phi_m(t))]$$
$$= G \cdot |S_{in}|_{pk} \cdot [\cos(\omega_C(t) + \theta(t)) + j\sin(\omega_C(t) + \theta(t))] \cdot$$
$$\sin(\phi_m(t))$$

Note that a fixed phase (phase which does not change over time) generated in the course of the frequency conversion or by the phase shift is omitted here.

Furthermore, from Formula (2), the following formula holds.

$$\sin\phi_m(t) = \frac{|S_{in}(t)|}{|S_{in}|_{pk}}$$

Thus, the output signal of the combining unit 7, i.e., the outphasing combined signal $S_{out}(t)$, which is the output signal of the outphasing amplification apparatus, is as shown in Formula (7).

[Formula 7]

$$S_{out}(t) = S_1(t) + (-S_2(t)) \quad (7)$$
$$= G \cdot |S_{in}|_{pk} \cdot [\cos(\omega_C(t) + \theta(t)) + j\sin(\omega_C(t) + \theta(t))] \cdot$$
$$\sin(\phi_m(t))$$
$$= G \cdot |S_{in}(t)| \cdot [\cos(\omega_C(t) + \theta(t)) + j\sin(\omega_C(t) + \theta(t))]$$

As described above, with the outphasing amplification apparatus according to the related art, as shown in the above Formula (1), $|S_{in}(t)| \cdot (\cos \theta(t) + j \sin \theta(t))$ the input baseband signal $S_{in}(t)$ expressed by the above formula, is converted into a Radio Frequency (hereinafter referred to as RF), and the outphasing combined signal $S_{out}(t)$, the gain of which has been amplified by G times, can be obtained. Thus, the linearity amplification apparatus using the two amplifiers 6a and 6b, which are constant amplitude amplifiers, can be achieved.

Under the condition in which the non-linearity compensation unit 1 is operated, in the above Formulas (1) to (7). $S_{in}(t)$ may be replaced by $S_{pd}(t)$, $|S_{in}(t)|$ may be replaced by $|S_{pd}(t)|$, and $|S_{in}|_{pk}$ may be replaced by $S_{pd}|_{pk}$.

Hereinafter, for convenience of the descriptions, one of two routes branched by the signal separation unit 2 from the DAC+Filter 3a to the first amplifier 6a is referred to as a first branch or simply a branch, while the other one of the two routes branched by the signal separation unit 2 from the DAC+Filter 3b to the second amplifier 6b is referred to as a second branch or simply a branch.

When the Chireix combiner is used as the combining unit 7, as described above, the amplitudes of the output signals $S_1(t)$ and $S_2(t)$ of the respective amplifiers 6a and 6b become imbalance, because of the asymmetric input impedances of the respective input ports of the combining unit 7 viewed from the two amplifiers 6a and 6b. Thus, there is a problem that non-linearity is generated in the outphasing combined signal $S_{out}(t)$, which is the output signal of the combining unit 7, even when a constant amplitude amplifier such as a saturation amplifier is used as the amplifiers 6a and 6b.

Moreover, when the phase difference between the input signals $S_1(t)$ and $S_2(t)$ from the two amplifiers 6a and 6b input to the combining unit 7 is increased to control the amplitude of the outphasing combined signal $S_{out}(t)$ to be small, the amount of cancellation of the amplitude of the outphasing combined signal $S_{out}(t)$ decreases due to the above amplitude imbalance. This leads to another problem that a dynamic range of the amplitude (output power) of the outphasing combined signal $S_{out}(t)$ becomes narrow.

The above problems will be described with reference to the drawings.

FIG. 14 shows a phase relationship in the RF between $S_1(t)$ and $S_2(t)$ (and $-S_2(t)$) and $S_{out}(t)$ when the amplitudes of the input signals $S_1(t)$ and $S_2(t)$ from the respective amplifiers 6a and 6b to the combining unit 7 are equal ($|S_1(t)|=|-S_2(t)|$).

FIG. 15 shows a phase relationship in the RF between $S_1(t)$ and $S_2(t)$ (and $-S_2(t)$) and $S_{out}(t)$ when the amplitudes of the input signals $S_1(t)$ and $S_2(t)$ from the respective amplifiers 6a and 6b to the combining unit 7 are not equal ($|S_1(t)|\neq|-S_2(t)|$).

Both FIGS. 14 and 15 show the phase relationship using, as a reference (by replacing the RF phase ($\omega_C(t)+\theta(t)$) by zero), the RF phase ($\omega_C(t)+\theta(t)$) of the outphasing combined signal $S_{out}(t)$ when the amplitudes of the input signals $S_1(t)$ and $S_2(t)$ from the respective amplifiers 6a and 6b to the combining unit 7 are equal ($|S_1(t)|=|-S_2(t)|$) in order to simplify the drawing.

As can be seen from the comparison between FIGS. 14 and 15, with respect to the same $\varphi_m(t)$, which has been controlled according to $S_{in}(t)$, there is a phase difference $\Delta\Psi(t)$ between $S_{out}(t)$ when the amplitudes of the input signals $S_1(t)$ and $S_2(t)$ of the combining unit 7 are not equal ($|S_1(t)|\neq|-S_2(t)|$) and $S_{out}(t)$ when the amplitudes of the input signals $S_1(t)$ and $S_2(t)$ of the combining unit 7 are equal ($|S_1(t)|=|-S_2(t)|$). This phase difference $\Delta\Psi(t)$ corresponds to an AM (Amplitude Modulation)/PM (Phase Modulation) non-linearity characteristic. Here, the AM/PM non-linearity characteristic shows a change in an input/output phase difference (=phase of outphasing combined signal $S_{out}(t)$-phase of input baseband signal $S_{in}(t)$) with respect to a change in the amplitude (hereinafter referred to as an input amplitude as appropriate) of the input baseband signal $S_{in}(t)$ before signal separation (i.e., the signal before being separated into the phase modulated pair signals $S_{C1}(t)$ and $S_{C2}(t)$.

FIG. 16 shows an example of the amplitude imbalance (deviation) characteristic of $|S_1(t)|$ and $|-S_2(t)|$ with respect to a phase control amount of $S_{C1}(t)$ and $-S_{C2}(t)$ in the Chireix combiner (combining unit 7). Here, the phase control amount of $S_{C1}(t)$ and $-S_{C2}(t)$ is a phase control amount $(\pm(90-\varphi_m(t))$ deg; $0$ deg$\leq\varphi_m(t)\leq90$ deg) to be added to the phases of the input signals $S_1(t)$ and $S_2(t)$ of the combining unit 7. A maximum amplitude can be obtained by making the phases of $S_{C1}(t)$ and $-S_{C2}(t)$ in-phase with each other i.e., $(90-\varphi_m(t)=0$ deg). This phase control amount is referred to as an outphase angle, because it is a deflection angle from the in-phase.

FIG. 17 is a diagram showing an amplitude imbalance (deviation) characteristic of the Chireix combiner (combining unit 7) for the absolute value $(90-\varphi_m(t)$ deg; $0$ deg$\leq\varphi_m(t)\leq90$ deg) of the phase control amount of $S_{C1}(t)$ and $-S_{C2}(t)$ in FIG. 16 expressed as a deviation (dB), which is converted into the ratio of $|S_1(t)|/|-S_2(t)|$ to logarithmically transform it.

It can be seen that for the absolute value of the phase control amount of $S_{C1}(t)$ and $-S_{C2}(t)$, the amplitudes of $|S_1(t)|$ and $|-S_2(t)|$ are equal only at a few points including 0 deg at which the amplitude of the outphasing combined signal $S_{out}(t)$ reaches its maximum. However, with the outphasing amplification apparatus according to the related art shown in FIG. 12, the inter-branch amplitude imbalance (deviation) characteristic shown in FIGS. 16 and 17 cannot be compensated, because no means for observation and compensation is included.

FIG. 18 shows a change in the amplitude (output power) of the outphasing combined signal $S_{out}(t)$ normalized with the maximum value as 0 dB for the absolute value of the phase control amount of $S_{C1}(t)$ and $-S_{C2}(t)$. In FIG. 18, the dynamic range when there is an inter-branch amplitude imbalance (deviation) shown in FIG. 16 is compared with the dynamic range when there is no inter-branch amplitude imbalance (deviation).

When there is no inter-branch amplitude imbalance (deviation), the dynamic range is wide. On the other hand, when there is an inter-branch amplitude imbalance (deviation), the dynamic range of only about 22 dB is achieved, because when the phase difference between the input signals $S_1(t)$ and $S_2(t)$ from the two amplifiers 6a and 6b to the combining unit 7 in the outphasing control operation is increased to control the amplitude of the outphasing composite signal $S_{out}(t)$ to be small, the amount of cancellation of the amplitude of the outphasing combined signal $S_{out}(t)$ decreases.

FIG. 19 shows an example of an AM/AM non-linearity characteristic and an example of the AM/PM non-linearity characteristic caused by the inter-branch amplitude imbalance (deviation) shown in FIG. 16. Here, the AM/AM non-linearity characteristic refers to a change in an output amplitude ratio (=amplitude of normalized outphasing combined signal $S_{out}(t)$/amplitude of input baseband signal $S_{in}(t)$ before signal separation) with respect to a change in the amplitude (input amplitude) of the input baseband signal $S_{in}(t)$, which is a signal before being separated into the phase modulated pair signals $S_{C1}(t)$ and $S_{C2}(t)$. The AM/PM non-linearity characteristic is as described above.

In a low input amplitude region where the amplitude of the outphasing combined signal $S_{out}(t)$ is lower by 22 dB or more than the input amplitude at which the amplitude reaches its maximum, the influence of the inter-branch amplitude imbalance (deviation) is large, and thus the input baseband signal $S_{in}(t)$ cannot be reproduced with the decrease in the amount of cancellation of the outphasing combined signal $S_{out}(t)$ caused by the inter-branch amplitude imbalance (deviation). As described above, there is a problem that non-linearity compensation according to the related art alone cannot completely compensate (both of) the AM/AM non-linearity characteristic and the AM/PM non-linearity characteristic particularly in the low-input amplitude region. In the non-linearity compensation according to the related art, the input baseband signal $S_{in}(t)$ before signal separation is compared with the outphasing combined signal $S_{out}(t)$, and the non-linearity of the entire outphasing amplification apparatus is compensated for the input baseband signal Sin(t) before signal separation.

In order to solve the above-described problem, an apparatus including means for compensating the inter-branch amplitude imbalance (deviation) between two branches in the outphasing combining has been proposed (see, for example, Patent Literature 1, 2, and 3).

CITATION LIST

Patent Literature

Patent Literature 1: Japanese Patent No. 5906967
Patent Literature 2: Japanese Unexamined Patent Application Publication No. 2015-146529
Patent Literature 3: Japanese Unexamined Patent Application Publication No. 2016-127577

Non Patent Literature

Non Patent Literature 1: Frederic H. Raab, "Efficiency of Outphasing RF Power-Amplifier Systems," IEEE Transactions on Communications, vol. 33, no. 10, pp. 1094-1099, October 1985.
Non Patent Literature 2: J. Qureshi, M. J. Pelk, M. Marchetti, W. C. Edmund Neo, J. R. Gajadharsing. M. P. van der Heijden, and L. C. N. de Vreede, "A 90-W Peak Power GaN Outphasing Amplifier With Optimum Input Signal Conditioning," in IEEE Transactions on Microwave Theory and Techniques, Vol. 57, No. 8, pp. 1925-1935. August 2009.

SUMMARY OF INVENTION

Technical Problem

A distortion compensation apparatus disclosed in Patent Literature 1 includes a calculation unit that calculates a non-linearity compensation coefficient (distortion compensation coefficient) for an entire apparatus, a first coefficient for one of branches, and a second coefficient for the other one of the branches based on an output signal of a non-linearity compensation unit (distortion compensation unit) for compensating non-linearity of an entire outphasing amplification apparatus, an output signal of a first adjusting unit for the one of the branches, an output signal of a second adjusting unit for the other one of the branches, and an output signal of a combining unit. The distortion compensation apparatus disclosed in Patent Literature 1 calculates inverse characteristics of the above three kinds of the non-linearity characteristics by obtaining the non-linearity characteristic of the branches respectively including two amplifiers and the non-linearity characteristic of the entire apparatus. Then, the amplification apparatus disclosed in Patent Literature 1 multiplies the input baseband signal by the inverse characteristic of the entire apparatus at an input stage of the outphasing amplification apparatus, and multiplies each of branch signals, which are separated into two signals having a phase difference between them according to the amplitude of the input baseband signal at a signal separation unit (signal generation unit) by the inverse characteristic of the non-linearity of the respective branches to thereby compensate the non-linearity of the entire apparatus and the inter-branch amplitude imbalance.

However, the distortion compensation apparatus disclosed in Patent Literature 1 has a problem (as mentioned as a problem to be solved in Patent Literature 3 described later) that the circuit size is large, because it observes the output signal of the non-linearity compensation unit, the output signal of the first adjustment unit for the one of the branches, the output signal of the second adjustment unit for the other one of the branches, and the output signal of the combining unit so as to compensate the non-linearity characteristic of the entire outphasing amplifier and the inter-branch amplitude imbalance. There is another problem in the distortion compensation apparatus disclosed in Patent Literature 1 that an amount of calculation is large, which leads to a large calculation load, because it calculates the non-linearity characteristic of the entire apparatus and the non-linearity characteristic of each branch, and then calculates the inverse characteristics of these three non-linearity, and further, each of the inverse characteristics are obtained by calculating a coefficient of a function modeled by a polynomial in such a way to reduce an error and by sequentially updating it.

An amplification apparatus disclosed in Patent Literature 2 calculates a reflection coefficient for each amplifier by two directional couplers provided at respective output stages of two amplifiers monitoring traveling waves and reflected waves. Then, the amplification apparatus disclosed in Patent Literature 2 adjusts the amplitude of the input signal of one of the amplifiers so that the load impedances (reflection coefficients) of the respective amplifiers are balanced.

However, the amplification apparatus disclosed in Patent Literature 2 has a problem that a circuit size is large, because it includes, at the respective output stages of the two amplifiers, the directional couplers and a reflection coefficient calculation unit for calculating the reflection coefficient from a result of the directional couplers monitoring the traveling waves and reflected waves, a comparison unit for comparing the two reflection coefficients calculated by the two reflection coefficient calculation units, and an amplitude variable unit for varying an amplitude of one of the amplifiers based on a result of the comparison by the comparison unit. The amplification apparatus disclosed in Patent Literature 2 has another problem that a matching adjustment between respective outputs of the amplifiers and inputs of combiners is difficult, because it needs to include the directional couplers respectively between outputs of the respective amplifiers and combiners.

A distortion compensation apparatus disclosed in Patent Literature 3 (in order to solve the problem that the amount of calculation processing in Patent Literature 1 is large), an inverse characteristic calculation unit for calculating an inverse characteristic of non-linearity of the entire outphasing amplification apparatus), a replica signal calculation unit for calculating a replica signal for one of branch signals, which is a first branch signal, based on the inverse characteristic of the non-linearity of the entire apparatus, one of the branch signals, which is a second branch signal, and an output signal of the outphasing amplification apparatus, a correction amount calculation unit for calculating an inverse characteristic of non-linearity of a first branch, and an adjusting unit for multiplying the inverse characteristic of the non-linearity of the first branch by the first branch signal. The distortion compensation apparatus disclosed in Patent Literature 3 corrects inter-branch amplitude imbalance.

However, the distortion compensation apparatus disclosed in Patent Literature 3 only adopts a measure to calculate a correction amount for one of the branches and make a correction without calculating correction amounts for both branches in an attempt to solve the problem in Patent Literature 1 that the amount of calculation processing is large. Thus, the distortion compensation apparatus disclosed in Patent Literature 3 has a problem that the circuit size is large, because it observes an output signal of a non-linearity compensation unit (distortion compensation unit), an output signal of the adjusting unit included only in one of the branches after signal separation, and one of branch signals, and an output signal of a combining unit. In addition, like the distortion compensation apparatus disclosed in Patent Literature 1, the distortion compensation apparatus disclosed in Patent Literature 3 obtains the inverse characteristics by calculating a coefficient of a function modeled by a polynomial in such a way to reduce an error and by sequentially updating it. For this reason, although the distortion compensation apparatus disclosed in Patent Literature 3 has a smaller amount of calculation than that of the distortion compensation apparatus disclosed in Patent Literature 1, the problem that the overall amount of calculation is large remains unsolved.

In view of the above-described problems, an object of the present disclosure is to provide an amplification apparatus and an amplification method that can achieve both compensation of non-linearity of the entire amplification apparatus and compensation of inter-branch amplitude imbalance with a small circuit configuration and with a significantly reduced amount of calculation processing.

Solution to Problem

In order to solve the above problems, an amplification apparatus according to the present disclosure includes:
  a first amplifier provided in a first branch;
  a second amplifier provided in a second branch;
  a signal separation unit configured to perform phase modulation on an input baseband signal input to the amplification apparatus according to an amplitude of the input baseband signal to thereby separate the input baseband signal into a pair of phase modulated signals of a constant amplitude, output one of the pair of the phase modulated signals to the first branch as a first branch signal, and output the other one of the pair of the phase modulated signals to the second branch as a second branch signal;
    a combining unit configured to combine an output signal of the first amplifier with an output signal of the second amplifier and output the combined signal from the amplification apparatus;
    a non-linearity compensation unit provided at an input stage of the signal separation unit and configured to multiply the input baseband signal by a non-linearity compensation coefficient for compensating non-linearity of the entire amplification apparatus;
  a first deviation compensation unit provided at an output stage of the signal separation unit and configured to multiply the first branch signal by a first deviation compensation coefficient for compensating a deviation between the first branch and the second branch;
  a second deviation compensation unit provided at the output stage of the signal separation unit and configured to multiply the second branch signal by a second deviation compensation coefficient for compensating the deviation between the first branch and the second branch; and a compensation coefficient calculation unit configured to calculate the non-linearity compensation coefficient, the first deviation compensation coefficient, and the second deviation compensation coefficient based on the input baseband signal and a feedback baseband signal obtained by feeding back the combined signal.

In order to solve the above problems, an amplification method performed by an amplification apparatus according to the present disclosure includes:

multiplying an input baseband signal input to the amplification apparatus by a non-linearity compensation coefficient for compensating non-linearity of the entire amplification apparatus;

performing phase modulation on a signal obtained by multiplying the input baseband signal by the non-linearity compensation coefficient according to an amplitude of the input baseband signal to thereby separate the signal into a pair of phase modulated signals of a constant amplitude;

multiplying, at a first branch, a first branch signal, which is one of the pair of phase modulated signals, by a first deviation compensation coefficient for compensating a deviation between the first branch and a second branch, amplifying power by a first amplifier, and outputs the amplified signal;

multiplying, at the second branch, a second branch signal, which is another one of the pair of phase modulated signals, by a second deviation compensation coefficient for compensating the deviation between the first branch and the second branch, amplifying power by a second amplifier, and outputs the amplified signal;

combining an output signal of the first amplifier with an output signal of the second amplifier and outputting the combined signal from the amplification apparatus; and calculating the non-linearity compensation coefficient, the first deviation compensation coefficient, and the second deviation compensation coefficient based on the input baseband signal and a feedback baseband signal obtained by feeding back the combined signal.

Advantageous Effects of Invention

According to the present disclosure, it is possible to obtain an effect that can achieve both compensation of non-linearity of an entire amplification apparatus and compensation of inter-branch amplitude imbalance with a small circuit configuration and with a significantly reduced amount of calculation processing.

DESCRIPTION OF EMBODIMENTS

Hereinafter, an embodiment of the present disclosure will be described with reference to the drawings.

Configuration of Embodiment

Figure 1:
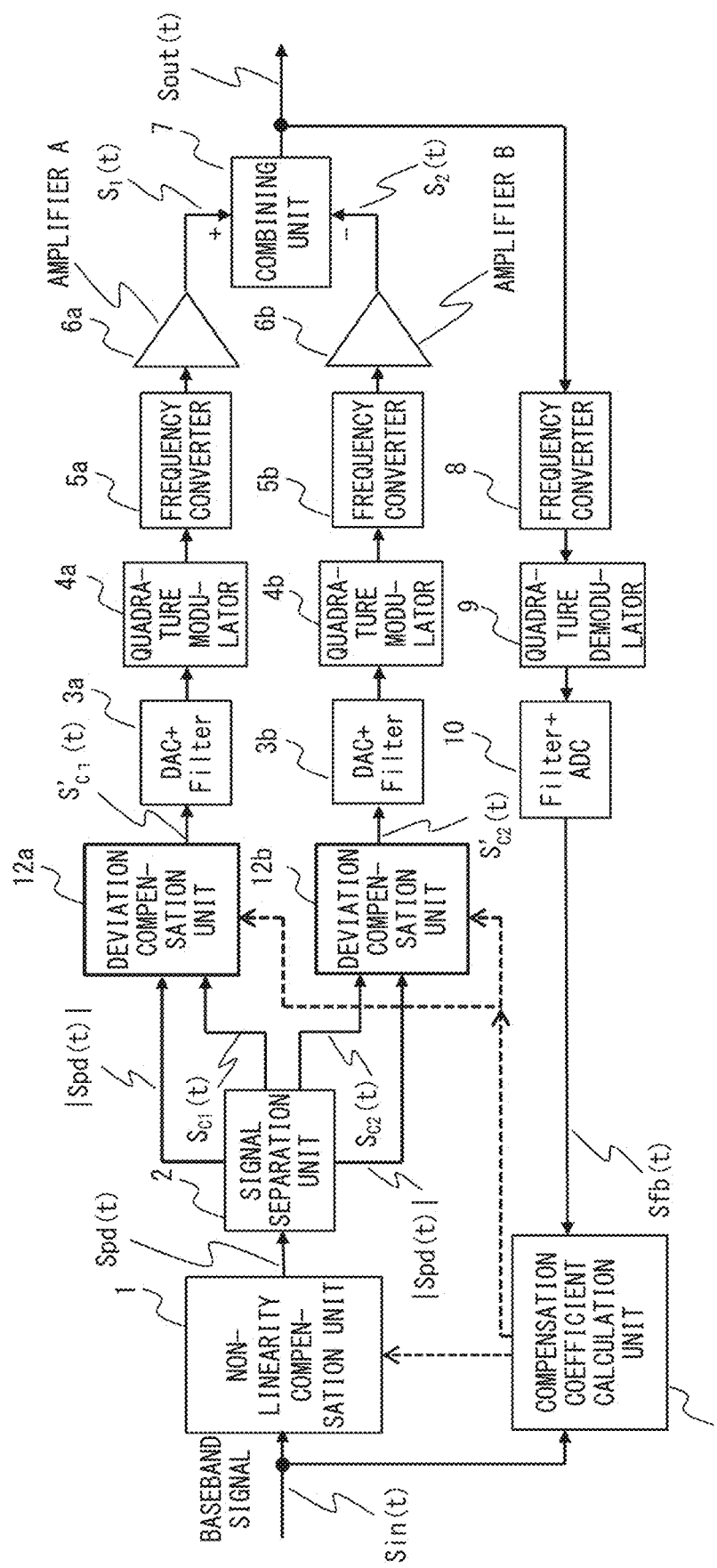
FIG. 1 is a block diagram showing a configuration example of an outphasing amplification apparatus according to an embodiment of the present disclosure.

FIG. 1 is a block diagram of an example of a configuration of an outphasing amplification apparatus according to this embodiment. In FIG. 1, the same components as those of the outphasing amplification apparatus according to the related art shown in FIG. 12 are denoted by the same reference signs, and descriptions of those components are omitted here, because they have already been described in the section of Background Art.

Figure 12:
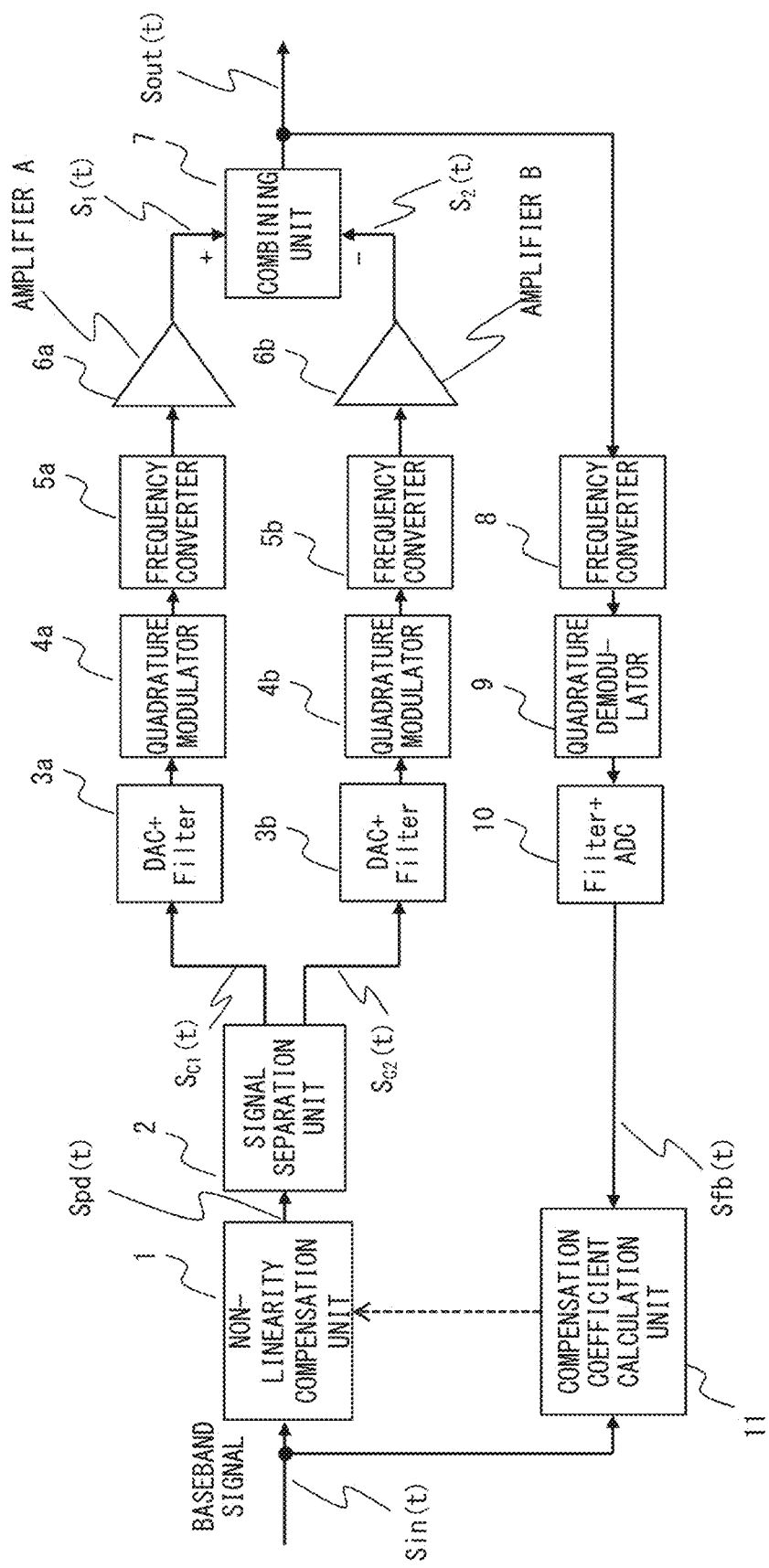
FIG. 12 is a block diagram showing an example of a configuration of an outphasing amplification apparatus according to related art.
Figure 13:
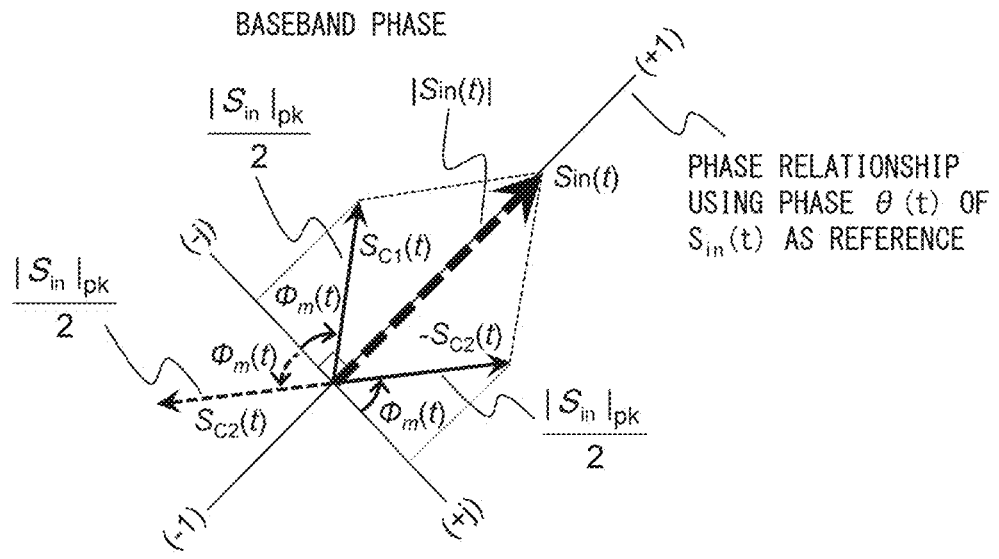
FIG. 13 is a diagram showing a relationship between an input baseband signal $S_{in}(t)$ and phase modulated pair signals $S_{C1}(t)$ and $S_{C2}(t)$ (and $-S_{C2}(t)$) in outphasing control.
Figure 14:
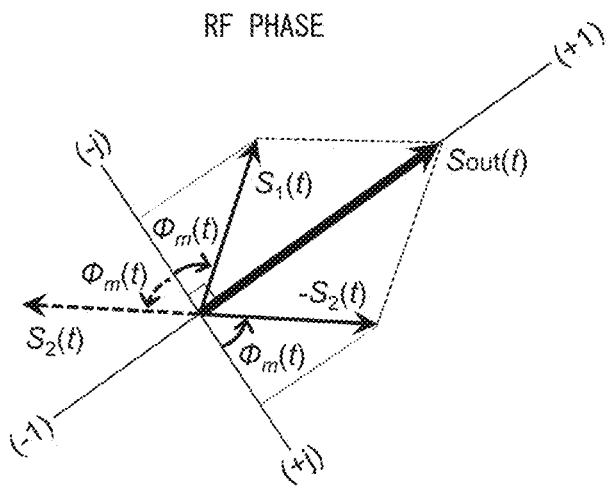
FIG. 14 shows a phase relationship in RF between $S_1(t)$ and $S_2(t)$ (and $-S_2(t)$) and $S_{out}(t)$ when amplitudes of input signals $S(t)$ and $S_2(t)$ of the combining unit are equal.
Figure 15:
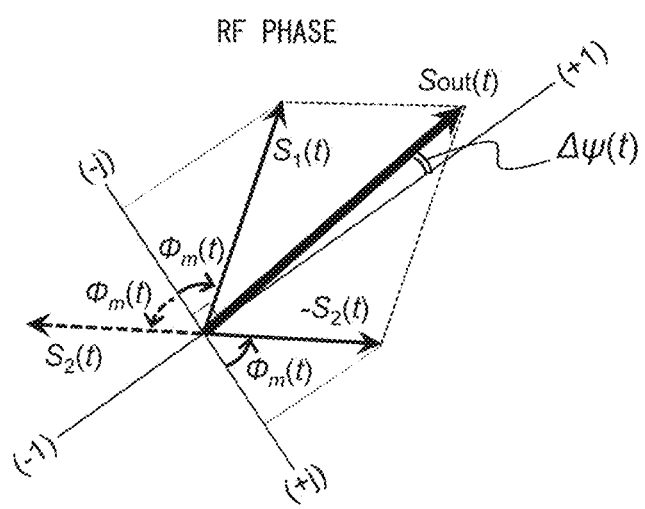
FIG. 15 shows a phase relationship in RF between $S_1(t)$ and $S_2(t)$ (and $-S_2(t)$) and $S_{out}(t)$ when amplitudes of input signals $S_1(t)$ and $S_2(t)$ of the combining unit are not equal.
Figure 16:
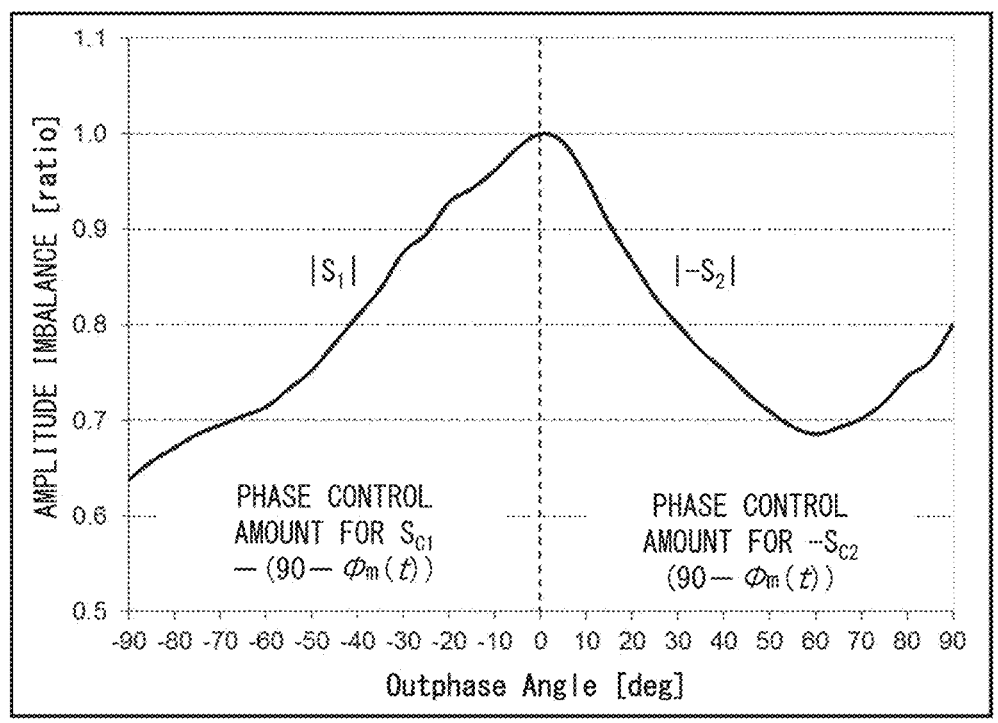
FIG. 16 shows an example of an amplitude imbalance (deviation) of $|S_1(t)|$ and $|-S_2(t)|$ with respect to a phase control amount of $S_{C1}(t)$ and $-S_{C2}(t)$ in a Chireix combiner.
Figure 17:
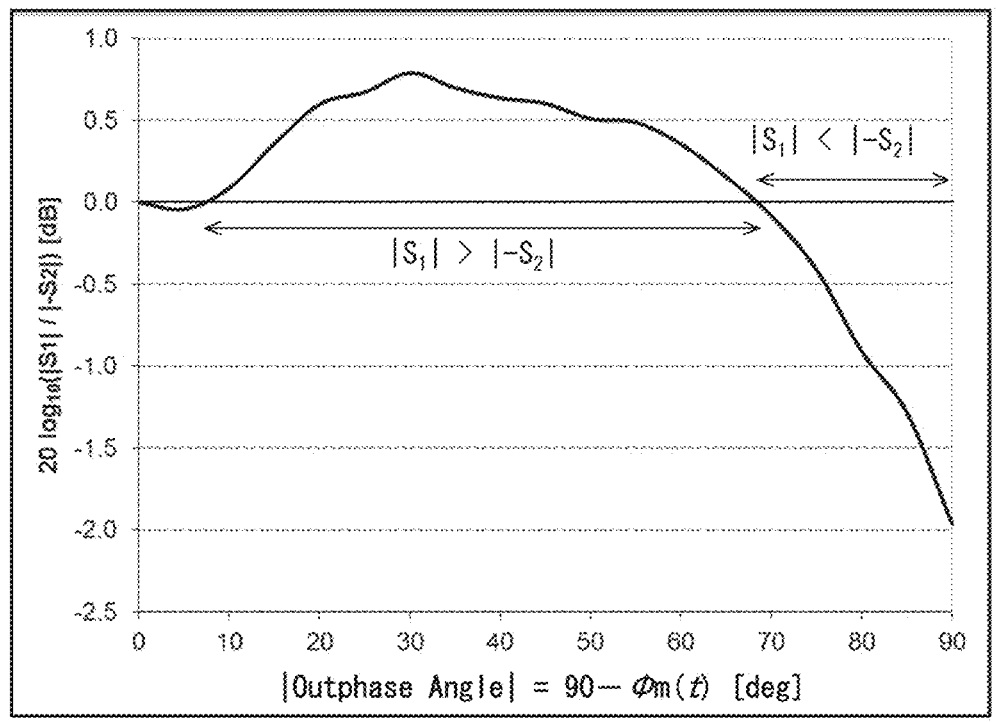
FIG. 17 is a diagram showing an amplitude imbalance (deviation) characteristic of the Chireix combiner for a phase control amount of $S_{C1}(t)$ and $-S_{C2}(t)$ in FIG. 16 expressed as a deviation (dB), which is converted into the ratio of $|S_1(t)|/|-S_2(t)|$ to logarithmically transform it.

Circuit configurations added in FIG. 1 from FIG. 12 according to the related art are only a deviation compensation unit 12a and a deviation compensation unit 12b as means for compensating an inter-branch amplitude imbalance (deviation) between two branches of the outphasing amplification apparatus. The deviation compensation units 12a and 12b multiply phase modulated pair signals $S_{C1}(t)$ and $S_{C2}(t)$ of a constant amplitude from a signal separation unit 2 by respective deviation compensation coefficients.

Figure 2:
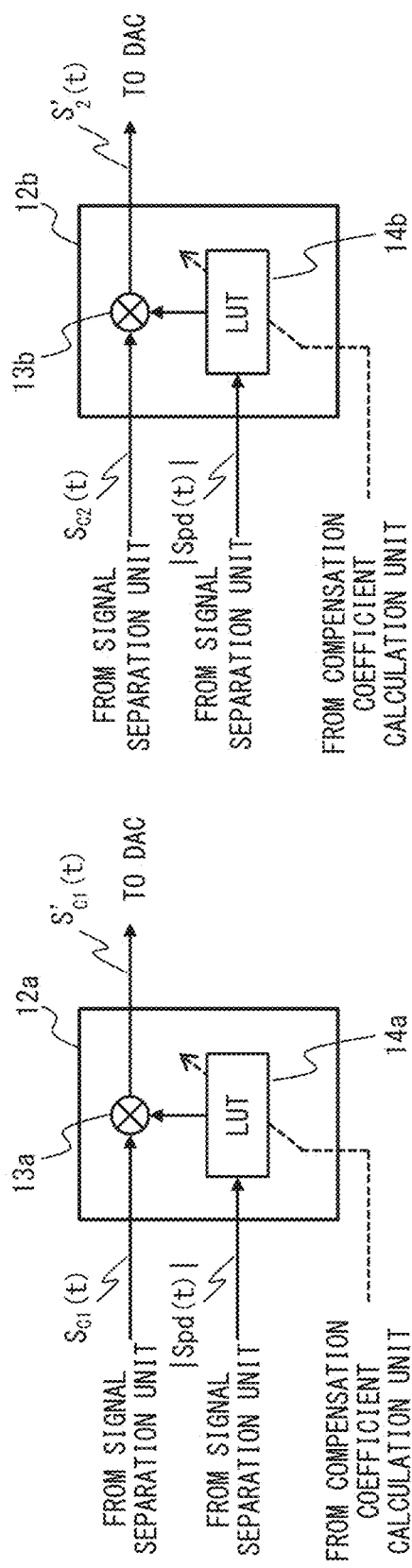
FIG. 2 is a block diagram showing an example of a configuration of a deviation compensation unit in the outphasing amplification apparatus shown in FIG. 1.

FIG. 2 is a block diagram showing a configuration example of the deviation compensation unit 12a and the deviation compensation unit 12b shown in FIG. 1.

As shown in FIG. 2, the deviation compensation unit 12a includes, for example, a multiplication unit 13a and a LUT (lookup table) 14a. The deviation compensation unit 12b includes, for example, a multiplication unit 13b and a LUT (lookup table) 14b.

Like in the related art, the signal separation unit 2 according to this embodiment outputs phase modulated pair signals $S_{C1}(t)$ and $S_{C2}(t)$ of a constant amplitude and also outputs an input signal $S_{pd}(t)$ of the signal separation unit 2, i.e., amplitude information of an amplitude $|S_{pd}(t)|$ of the output signal $S_{pd}(t)$ of a non-linearity compensation unit 1, to the deviation compensation unit 12a and the deviation compensation unit 12b. The signal separation unit 2 according to this embodiment outputs $S_{C1}(t)$ to the deviation compensation unit 12a and outputs $S_{C2}(t)$ to the deviation compensation unit 12b.

As described in the section of Background Art, the signal separation unit 2 calculates the amplitude $|S_{pd}(t)|$ of the input signal $S_{pd}(t)$ of the signal separation unit 2 in the process of deriving a phase modulation angle $\varphi_m(t)$. Thus, the above amplitude information is known in the related art, and does not require new additional calculation in this embodiment.

The LUT 14a is a lookup table in which the amplitude $|S_{pd}(t)|$ of the output signal $S_{pd}(t)$ of the non-linearity compensation unit 1 is associated with the deviation compensation coefficient of the deviation compensation unit 12a. The deviation compensation unit 12a acquires the deviation compensation coefficient corresponding to $|S_{pd}(t)|$ from the LUT 14a based on the amplitude information of the amplitude $|S_{pd}(t)|$ from the signal separation unit 2, and the multiplication unit 13a multiplies the acquired deviation compensation coefficient by the output signal $S_{C1}(t)$ from the signal separation unit 2 and outputs the multiplied signal.

Likewise, the LUT 14b is a lookup table in which the amplitude $|S_{pd}(t)|$ of the output signal $S_{pd}(t)$ of the non-linearity compensation unit 1 is associated with the deviation compensation coefficient of the deviation compensation unit 12b. The deviation compensation unit 12b acquires the deviation compensation coefficient corresponding to $|S_{pd}(t)|$ from the LUT 14b based on the amplitude information of the amplitude $|S_{pd}(t)|$ from the signal separation unit 2, and the multiplication unit 13b multiplies the acquired deviation compensation by the output signal $S_{C2}(t)$ from the signal separation unit 2 and outputs the multiplied signal.

The compensation coefficient calculation unit 11 according to this embodiment compares only an input baseband signal $S_{in}(t)$ input to the outphasing amplification apparatus with a feedback baseband signal $S_{fb}(t)$, which is an outphasing combined signal output from the outphasing amplification apparatus fed back as an output monitor signal. Then, the compensation coefficient calculation unit 11 calculates a non-linearity coefficient for compensating non-linearity as the entire apparatus based on a result of the comparison between the input baseband signal $S_{in}(t)$ and the feedback baseband signal $S_{fb}(t)$ and outputs it to the non-linearity compensation unit 1. The compensation coefficient calculation unit 11 also calculates the deviation compensation coefficients for compensating the inter-branch amplitude imbalance (deviation) between two branches by a calculation method described later and outputs them to the deviation compensation unit 12a and the deviation compensation unit 12b, respectively.

Operation of Embodiment

Hereinafter, an operation of the outphasing amplification apparatus according to the embodiment of the present disclosure will be described. Means for comparing the input baseband signal $S_{in}(t)$ with the feedback baseband signal $S_{fb}(t)$ to thereby calculate the non-linearity compensation coefficient for compensating the non-linearity of the entire apparatus is not limited to the outphasing amplification apparatus, and instead various types of such means has been proposed in related art. Thus, the description of such means is omitted here.

The following is a description about the compensation coefficient calculation unit 11 according to this embodiment comparing only the input baseband signal $S_{in}(t)$ with the feedback baseband signal $S_{fb}(t)$, so that the deviation compensation coefficients for compensating the inter-branch amplitude imbalance (deviation) between the two branches can be calculated.

As described above, the feedback baseband signal $S_{fb}(t)$ is the outphasing combined signal $S_{out}(t)$, which is an output signal of the combining unit 7 converted into a signal of a baseband frequency by a frequency converter 8, a quadrature demodulator 9, and a Filter+ADC 10, and then fed back as an output monitor signal.

Figure 3A:
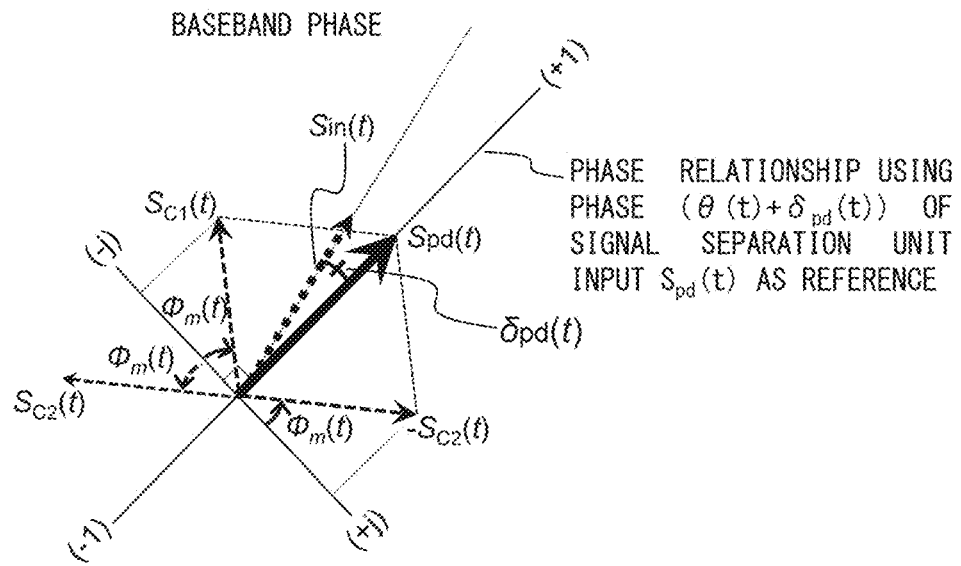
FIG. 3A is a diagram showing a phase relationship in baseband between an input signal $S_{pd}(t)$ of a signal separation unit and $S_{C1}(t)$ and $S_{C2}(t)$ (and $-S_{C2}(t)$) generated by the signal separation unit.
Figure 3B:
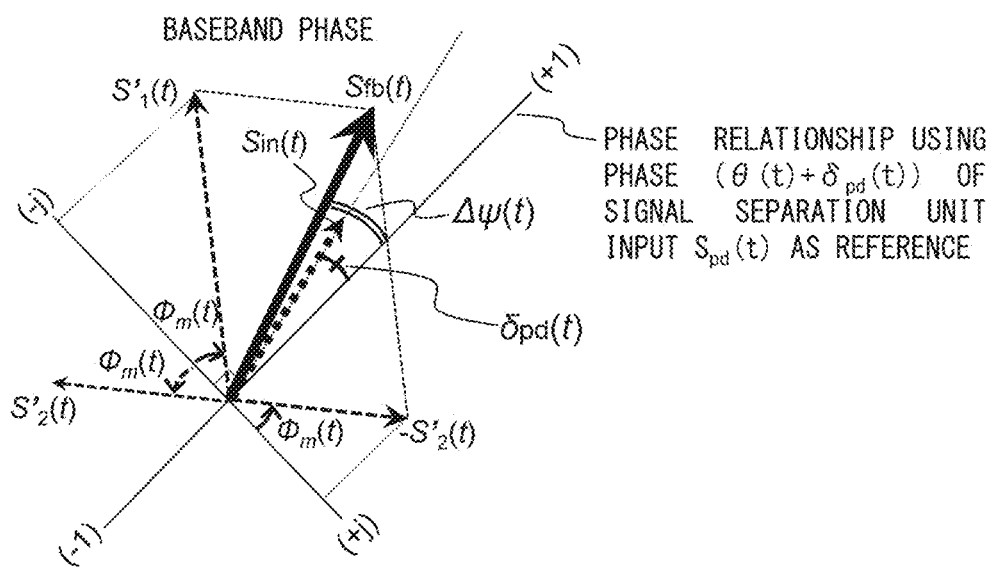
FIG. 3B is a diagram for describing a phase relationship in baseband between $S'_1(t)$ and $S'_2(t)$ (and $-S'_2(t)$) when amplitudes of input signals $S'_1(t)$ and $S'_2(t)$ of the combining unit are not equal and a phase difference $\Delta\Psi(t)$ between feedback baseband signals $S_{fb}(t)$ and $S_{pd}(t)$ generated by the phase relationship.

FIG. 3A shows a phase relationship in baseband between the input signal $S_{pd}(t)$ of the signal separation unit 2 and $S_{C1}(t)$ and $S_{C2}(t)$ (and $-S_{C2}(t)$) generated by the signal separation unit 2. In FIG. 3A, the phase of the input signal $S_{pd}(t)$ of the signal separation unit 2 is used as a reference. Hereinafter, $S_1(t)$ and $S_2(t)$ when $|S_1(t)| \neq |-S_2(t)|$ are represented by $S'_1(t)$ and $S'_2(t)$, respectively. FIG. 3B is a diagram for describing a phase relationship in baseband between the input signals $S'_1(t)$ and $S'_2(t)$ (and $-S'_2(t)$) of the combining unit 7 when the amplitudes of the input signals of the combining unit 7 from respective amplifiers 6a and 6b are not equal ($|S'_1(t)| \neq |-S'_2(t)|$) and a phase difference $\Delta\Psi(t)$ between the feedback baseband signal $S_{fb}(t)$ and the input signal $S_{pd}(t)$ of the signal separation unit 2 generated by the phase relationship. In FIG. 3B, the phase of the input signal $S_{pd}(t)$ of the signal separation unit 2 is used as a reference. The reason why the phase of the input signal $S_{pd}(t)$ of the signal separation unit 2 is represented as a reference is that outphasing phase control is performed based on the phase of $S_{pd}(t)$.

In an output stage of the signal separation unit 2, $|S_{C1}(t)|$ and $|-S_{C2}(t)|$ are equal. However, the amplitudes of the output signals from the respective amplifiers 6a and 6b, i.e., the amplitudes $|S'_1(t)|$ and $|-S'_2(t)|$ of the input signals of the combining unit 7, are unbalanced due to an asymmetric input impedance of the Chireix combiner (combining unit 7), resulting in $|S'_1(t)| \neq |-S'_2(t)|$.

At this time, like in FIG. 3B, when the phase of the input signal $S_{pd}(t)$ of the signal separation unit 2 is used as a reference, $S'_1(t)$, $S'_2(t)$, and $S_{fb}(t)$ can be expressed by the Formula (8) and Formula (9).

[Formula 8]

$$S'_1(t) = |S'_1(t)| \cdot [\sin(\phi_m(t)) - j\cos(\phi_m(t))]$$
$$S'_2(t) = |S'_2(t)| \cdot [-\sin(\phi_m(t)) - j\cos(\phi_m(t))]$$ (8)

[Formula 9]

$$\begin{aligned}S_{fb}(t) &= S'_1(t) - S'_2(t) \\ &= |S'_1(t)| \cdot [\sin(\phi_m(t)) - j\cos(\phi_m(t))] - \\ &\quad |S'_2(t)| \cdot [-\sin(\phi_m(t)) - j\cos(\phi_m(t))] \\ &= (|S'_1(t)| + |S'_2(t)|) \cdot \sin(\phi_m(t)) - \\ &\quad (|S'_1(t)| - |S'_2(t)|) \cdot j\cos(\phi_m(t))\end{aligned}$$ (9)

In the above Formula (9) which uses the phase of $S_{pd}(t)$ as a reference, the phase difference between $S_{pd}(t)$ and $S_{fb}(t)$ in the baseband is $\Delta\Psi(t)$. Thus, a tangent $\tan(\Delta\Psi(t))$ of $\Delta\Psi(t)$ can be calculated by the following Formula (10) with an in-phase (I-phase) component and a quadrature (Q-phase) component of the feedback baseband signal represented by $S_{fb}(t)$ in the above Formula (9).

[Formula 10]

$$\tan(\Delta\psi(t)) = \frac{(|S'_1(t)| - |S'_2(t)|) \cdot \cos(\phi_m(t))}{(|S'_1(t)| + |S'_2(t)|) \cdot \sin(\phi_m(t))} = \frac{(|S'_1(t)| - |S'_2(t)|)}{(|S'_1(t)| + |S'_2(t)|)} \cdot \frac{1}{\tan(\phi_m(t))}$$ (10)

In order to cancel the above phase difference $\Delta\Psi(t)$ between $S_{pd}(t)$ and $S_{fb}(t)$, the amplitude $|S_{C1}(t)|$ of the output signal $S_{C1}(t)$ for a first branch from the signal separation unit 2 and the amplitude $|S_{C2}(t)|$ of the output signal $S_{C2}(t)$ from the signal separation unit 2 may be previously compensated so that the phase of $S_{fb}(t)$, which is a signal after the non-linearity compensation unit 1 compensates the non-linearity of the entire apparatus, is rotated by $-\Delta\Psi(t)$.

When an amplitude that is obtained by the deviation compensation unit 12a compensating the amplitude $|S_{C1}(t)|$ of the output signal $S_{C1}(t)$ for the first branch from the signal separation unit 2 is represented by $|S'_{C1}(t)|$, and an amplitude that is obtained by the deviation compensation unit 12b compensating the amplitude $|S_{C2}(t)|$ of the output signal $S_{C2}(t)$ for the second branch from the signal separation unit 2 is represented by $|S'_{C2}(t)|$, $|S'_{C1}(t)|$ and $|S'_{C2}(t)|$ that previously rotate the phase of the combined outphasing combined signal $S_{out}(t)$ by $-\Delta\Psi(t)$ is required to have values satisfying the following Formula (11).

[Formula 11]

$$\tan(-\Delta\psi(t)) = \frac{-(|S'_{C1}(t)| - |S'_{C2}(t)|) \cdot \cos(\phi_m(t))}{(|S'_{C1}(t)| + |S'_{C2}(t)|) \cdot \sin(\phi_m(t))} = \frac{(|S'_{C2}(t)| - |S'_{C1}(t)|)}{(|S'_{C2}(t)| + |S'_{C1}(t)|)} \cdot \frac{1}{\tan(\phi_m(t))}$$ (11)

Next, in the above Formula (11), a coefficient (specific coefficient) $k(t)$ representing the ratio of $|S'_{C2}(t)|$ to $|S'_{C1}(t)|$ to be compensated, which is replaced by the following Formula (12), is introduced.

[Formula 12]

$$\frac{|S'_{C1}(t)|}{|S'_{C2}(t)|} = k(t)$$ (12)

When the above Formula (11) is converted using the above coefficient $k(t)$, it will be Formula (13).

[Formula 13]

$$\tan(-\Delta\psi(t)) = \frac{|S'_{C2}(t)| - |S'_{C1}(t)|}{|S'_{C2}(t)| + |S'_{C1}(t)|} \cdot \frac{1}{\tan(\phi_m(t))} = \frac{1 - k(t)}{1 + k(t)} \cdot \frac{1}{\tan(\phi_m(t))}$$ (13)

The Formula (13) can be further transformed into Formula (14).

[Formula 14]

$$k(t) \cdot [1 + \tan(\phi_m(t)) \cdot \tan(-\Delta\psi(t))] = 1 - \tan(\phi_m(t)) \cdot \tan(-\Delta\psi(t))$$ (14)

From the above Formula (14), the coefficient $k(t)$ representing the ratio of $|S'_{C2}(t)|$ to $|S'_{C1}(t)|$ to be compensated is expressed by Formula (15).

[Formula 15]

$$k(t) = \frac{|S'_{C1}(t)|}{|S'_{C2}(t)|} = \frac{1 - \tan(\phi_m(t)) \cdot \tan(-\Delta\psi(t))}{1 + \tan(\phi_m(t)) \cdot \tan(-\Delta\psi(t))} \quad (15)$$

First, in the state before the non-linearity compensation unit 1 is operated, the input signal $S_{pd}(t)$ of the signal separation unit 2 is equal to the input baseband signal $S_{in}(t)$. At that time, $\Delta\Psi(t)$ is a phase difference between the input baseband signal $S_{in}(t)$ and the feedback baseband signal $S_{fb}(t)$ in the baseband. Thus, $\Delta\Psi(t)$ is equal to the AM/PM non-linearity characteristic of the entire apparatus that can be observed by the compensation coefficient calculation unit 11 included for the non-linearity compensation of the entire apparatus.

Thus, the coefficient k(t) can be expressed by Formula (16) by replacing $-\Delta\Psi(t)$, which is an inverse characteristic of the AM/PM non-linearity characteristic by $-AM/PM(t)$.

[Formula 16]

$$k(t) = \frac{|S'_{C1}(t)|}{|S'_{C2}(t)|} = \frac{1 - \tan(\phi_m(t)) \cdot \tan(-AM/PM(t))}{1 + \tan(\phi_m(t)) \cdot \tan(-AM/PM(t))} \quad (16)$$

Next, after the non-linearity compensation unit 1 is operated, as shown in FIG. 3B, when an amount of compensation of the AM/PM non-linearity characteristic added to a baseband phase $\theta(t)$ of the input baseband signal $S_{in}(t)$ among the non-linearity compensation amount of the entire apparatus is $\delta_{pd}(t)$, the phase of the input signal $S_{pd}(t)$ Of the signal separation unit 2 is $(\theta(t)+\delta_{pd}(t))$.

In a relatively high input amplitude region, even when the inter-branch amplitude imbalance (deviation) is not compensated, the phase difference $\Delta\Psi(t)$ caused by an imbalance between the amplitudes $|S'_1(t)|$ and $|-S'_2(t)|$ of the input signals of the combining unit 7 may be apparently compensated ($+\delta_{pd}(t)-\Delta\Psi(t)=0$ in FIG. 3B) only by the amount of compensation $\delta_{pd}(t)$ of the AM/PM non-linearity of the entire apparatus according to the amplitude $|S_{in}(t)|$ of the input baseband signal $S_{in}(t)$ by the non-linearity compensation unit 1.

Figure 18:
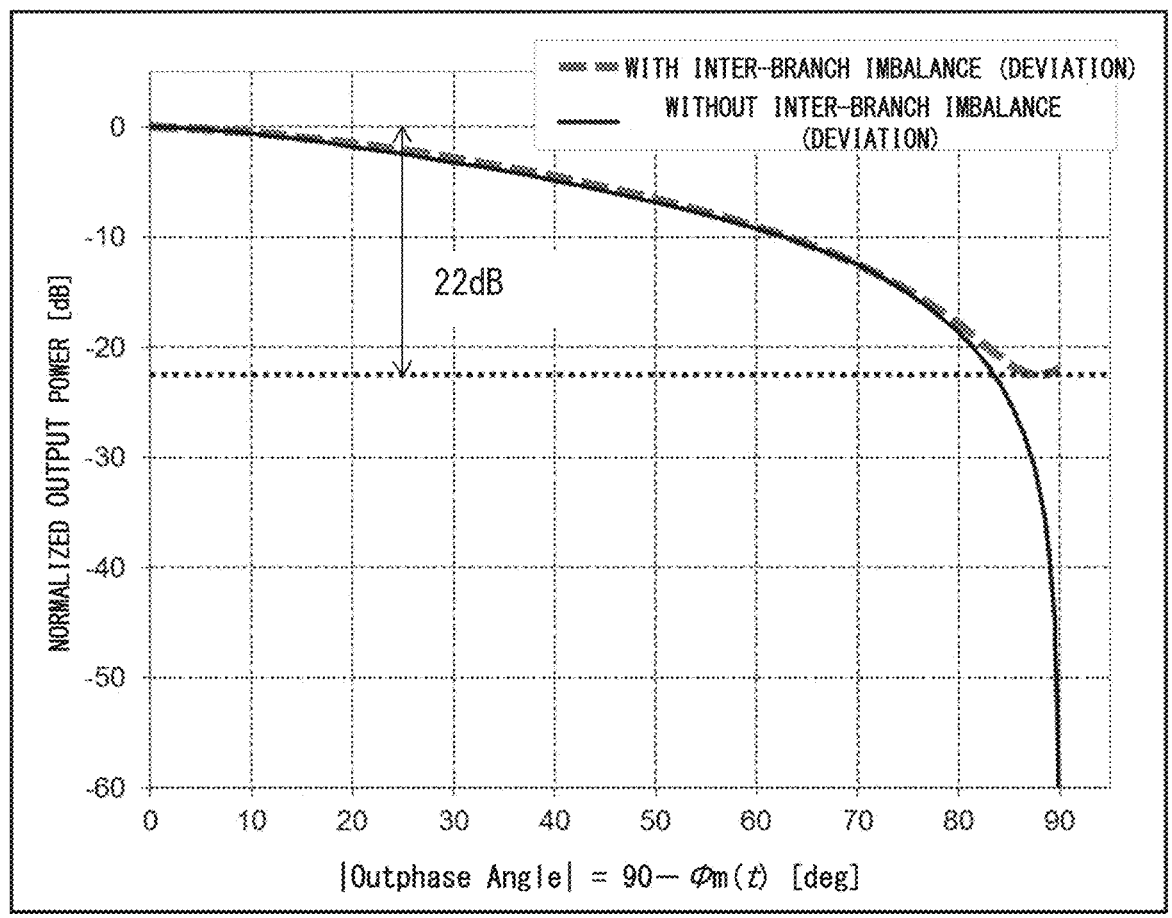
FIG. 18 shows a change in an amplitude (output power) of a outphasing combined signal $S_{out}(t)$ normalized with a maximum value as 0 dB for the phase control amount of $S_{C1}(t)$ and $-S_{C2}(t)$ and also shows a comparison between a dynamic range when there is an inter-branch amplitude imbalance (deviation) shown in FIG. 16 and a dynamic range when there is no inter-branch amplitude imbalance (deviation)
Figure 19:
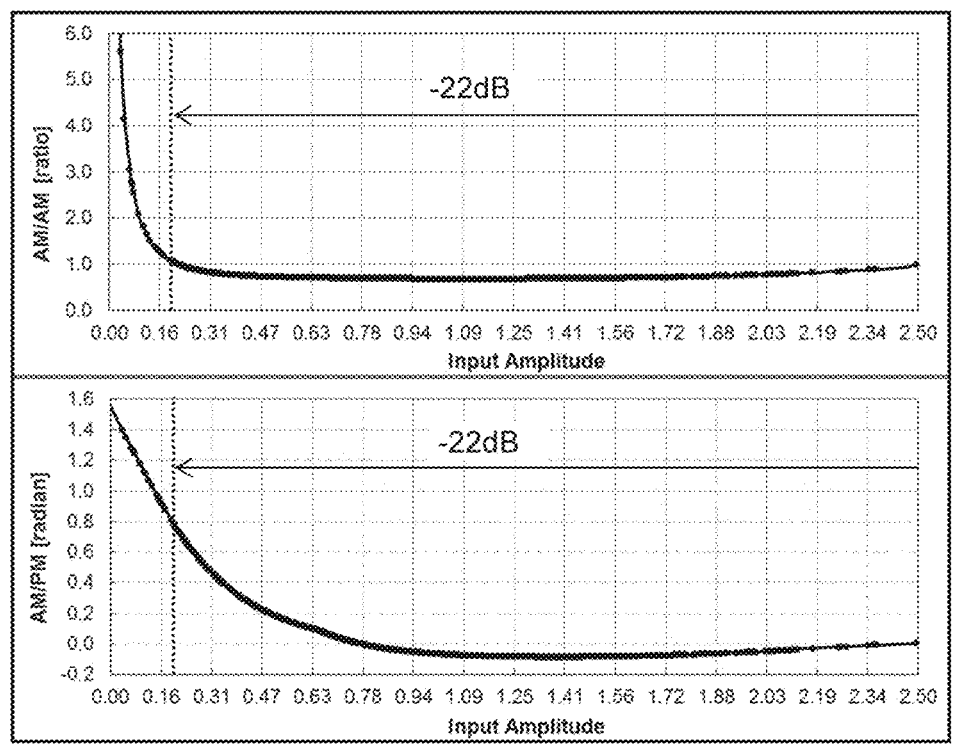
FIG. 19 is a diagram showing an example of the AM/AM non-linearity characteristic and an example of the AM/PM non-linearity characteristic generated by an amplitude characteristic of the Chireix combiner with respect to the phase control amount of $S_{C1}(t)$ and $-S_{C2}(t)$ shown in FIG. 16.

However, as shown in FIGS. 18 and 19, in the low input amplitude region in which the amplitude of the outphasing combined signal $S_{out}(t)$ is lower by 22 dB or more from the input amplitude (amplitude of $S_{in}(t)$) at which the amplitude reaches its maximum, the amount of cancellation of the amplitude of the outphasing combined signal $S_{out}(t)$ decreases due to the inter-branch amplitude imbalance (deviation) (for example, even when the phases of $S'_1(t)$ and $-S'_2(t)$ are inverted, the amplitude of the outphasing combined signal $S_{out}(t)$ cannot be lowered). For this reason, the input baseband signal $S_{in}(t)$ in the low input amplitude region cannot be reproduced.

Figure 4:
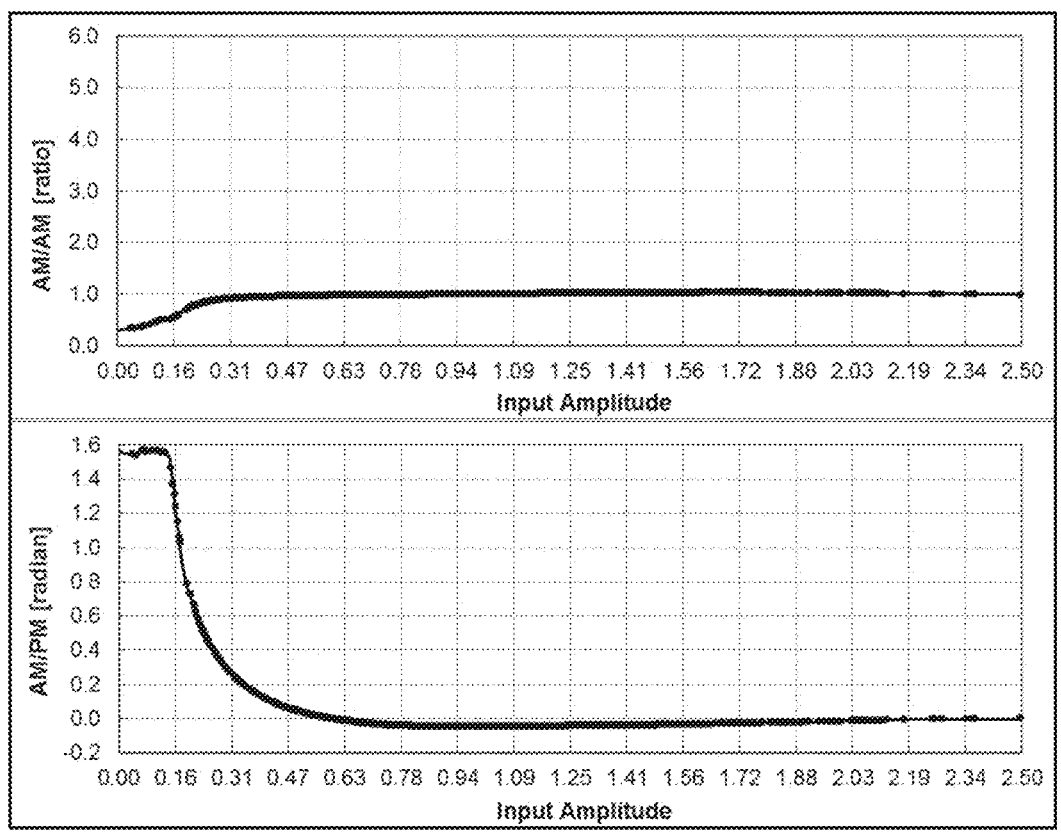
FIG. 4 is a diagram showing an example of an AM/AM non-linearity characteristic and an AM/PM non-linearity characteristic that remain after non-linearity compensation of the entire apparatus when only non-linearity of the entire outphasing amplification apparatus is compensated by a compensation method according to related art while inter-branch amplitude imbalance (deviation) is not compensated.

As an example, FIG. 4 shows an example of the AM/AM non-linearity characteristic and the AM/PM non-linearity characteristic that remain after non-linearity compensation of the entire apparatus when only non-linearity of the entire outphasing amplification apparatus is compensated by the compensation method according to the related art while inter-branch amplitude imbalance (deviation) is not compensated. As shown in FIG. 4, the non-linearity compensation of the entire apparatus alone cannot completely compensate (both of) the AM/AM non-linearity characteristic and AM/PM non-linearity characteristic, and thus the AM/PM non-linearity characteristic remains.

When the inverse characteristic of the remaining AM/PM non-linearity characteristic of the entire apparatus observed by the compensation coefficient calculation unit 11 after the AM/PM non-linearity characteristic of the entire apparatus is compensated is represented by $-AM/PM(t)$, the coefficient k(t) is as shown in the above Formula (16) even when the non-linearity compensation unit 1 is operated.

Figure 5:
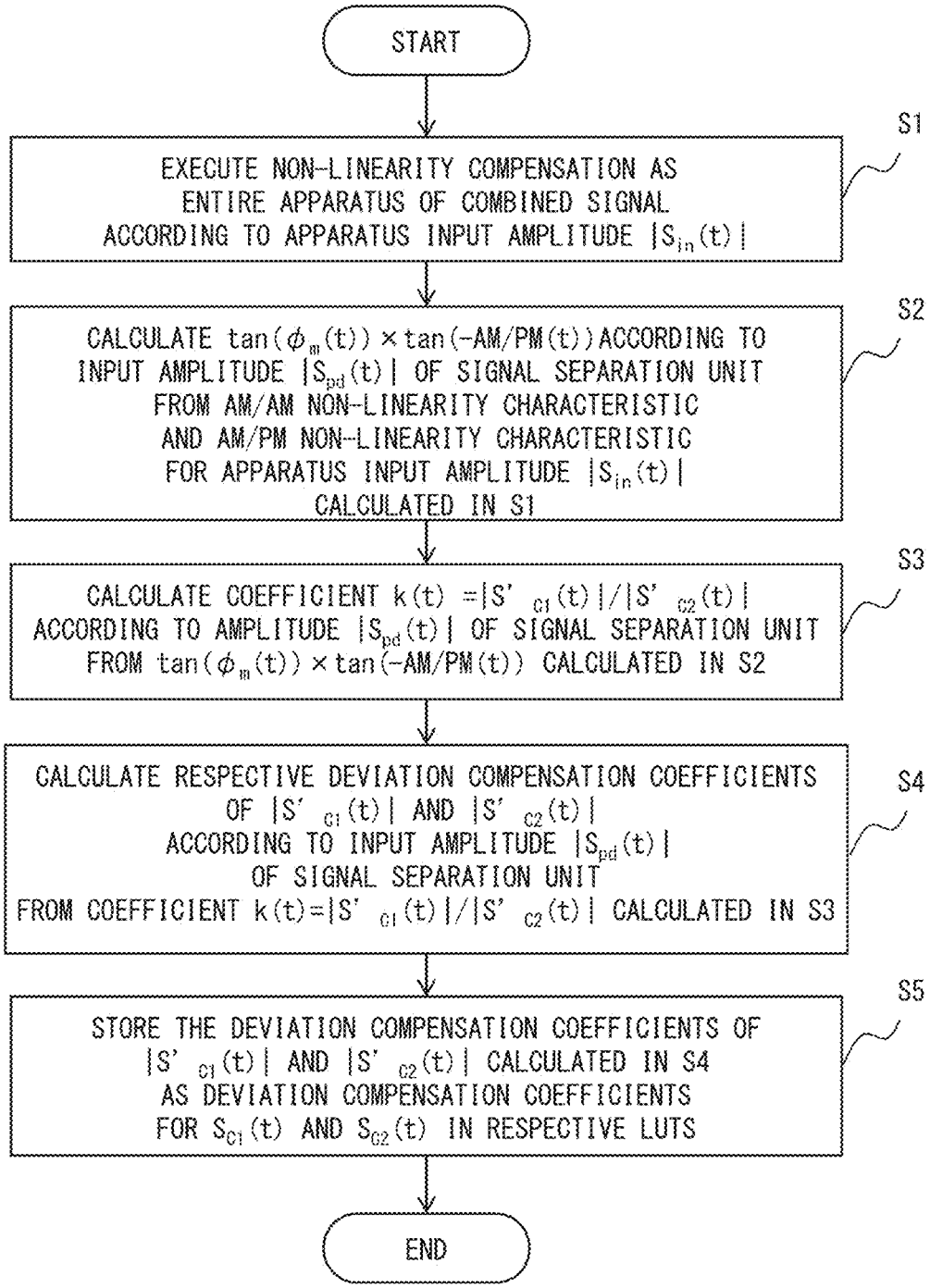
FIG. 5 is a diagram showing an example of an operation flow of a method of calculating a deviation compensation coefficient according to the embodiment of the present disclosure.

Hereinafter, a procedure for calculating the deviation compensation coefficient for compensating the inter-branch amplitude imbalance (deviation) based on the above Formula (16) will be described with reference to FIG. 5. FIG. 5 shows an example of an operation flow showing a method of calculating the deviation compensation coefficient according to this embodiment.

First, in the non-linearity compensation unit 1, the input baseband signal $S_{in}(t)$ is multiplied by the non-linearity compensation coefficient according to the amplitude $|S_{in}(t)|$ of the input baseband signal $S_{in}(t)$ to thereby compensate the non-linearity of the outphasing combined signal $S_{out}(t)$ of the entire apparatus (Step S1).

As described above, the compensation coefficient calculation unit 11 can observe the AM/PM non-linearity characteristic for the amplitude $|S_{in}(t)|$ of the input baseband signal $S_{in}(t)$ remaining after the non-linearity compensation of the entire apparatus, and inverts the sign of the observed AM/PM non-linearity characteristic to thereby calculate the compensation coefficient of the AM/PM non-linearity characteristic. Here, the AM/PM non-linearity characteristic is observed as a change in an input/output phase difference (=phase of outphasing combined signal $S_{out}(t)$-phase of input baseband signal $S_{in}(t)$ before signal separation) with respect to a change in the amplitude $|S_{in}(t)|$ (input amplitude) of the input baseband signal $S_{in}(t)$ before signal separation.

Further, the compensation coefficient calculation unit 11 can observe the AM/AM non-linearity characteristic for the amplitude $|S_{in}(t)|$ of the input baseband signal $S_{in}(t)$ simultaneously with the above-mentioned AM/PM non-linearity characteristic. The AM/AM non-linearity characteristic here is observed as a change in an output amplitude ratio (=amplitude of normalized outphasing combined signal $S_{out}(t)$/amplitude of input baseband signal $S_{in}(t)$ before signal separation) with respect to a change in the amplitude $|S_{in}(t)|$ (input amplitude) of the input baseband signal $S_{in}(t)$ before signal separation. When the AM/AM non-linearity characteristic is represented by AM/AM(t), the amplitude $|S_{pd}(t)|$ of the input signal $S_{pd}(t)$ from the non-linearity compensation unit 1 to the signal separation unit 2 is expressed by the following Formula (17).

[Formula 17]

$$|S_{pd}(t)| = \frac{|S_{in}(t)|}{AM/AM(t)} \quad (17)$$

Thus, the above-mentioned phase compensation coefficient according to the amplitude $|S_{in}(t)|$ of the input baseband signal $S_{in}(t)$ can be converted into a phase compensation coefficient according to the amplitude $|S_{in}(t)|$ of the input baseband signal $S_{in}(t)$ using the above AM/AM non-linearity characteristic for the amplitude $|S_{pd}(t)|$ of the input signal $S_{pd}(t)$ of the signal separation unit 2.

Figure 6:
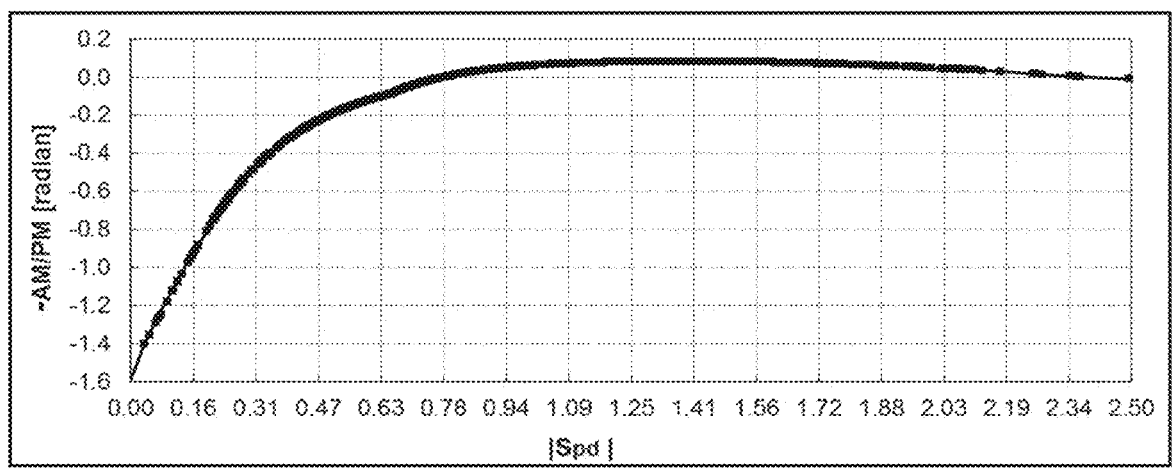
FIG. 6 shows an example of a phase compensation coefficient according to the amplitude $|S_{pd}(t)|$ of the input signal of the signal separation unit, which is necessary for compensating the AM/PM non-linearity characteristic caused by inter-branch amplitude imbalance (deviation)

FIG. 6 shows an example of the phase compensation coefficient according to the amplitude $|S_{pd}(t)|$ of the input signal $S_{pd}(t)$ of the signal separation unit 2, which is calculated in accordance with the above procedure and which is necessary for compensating the AM/PM non-linearity characteristic caused by the inter-branch amplitude imbalance (deviation).

Next, the compensation coefficient calculation unit 11 calculates $\tan(\varphi_m(t)) \times \tan(-AM/PM(t))$ according to the amplitude $|S_{pd}(t)|$ of the input signal $S_{pd}(t)$ of the signal separation unit 2 based on the phase compensation coefficient $(-AM/PM(t))$ of FIG. 6 according to the amplitude $|S_{pd}(t)|$ of the input signal $S_{pd}(t)$ of the signal separation unit 2 and known information about $\varphi_m(t)$ according to the amplitude $|S_{pd}(t)|$ of the input signal $S_{pd}(t)$ of the signal separation unit 2 (Step S2).

Figure 7:
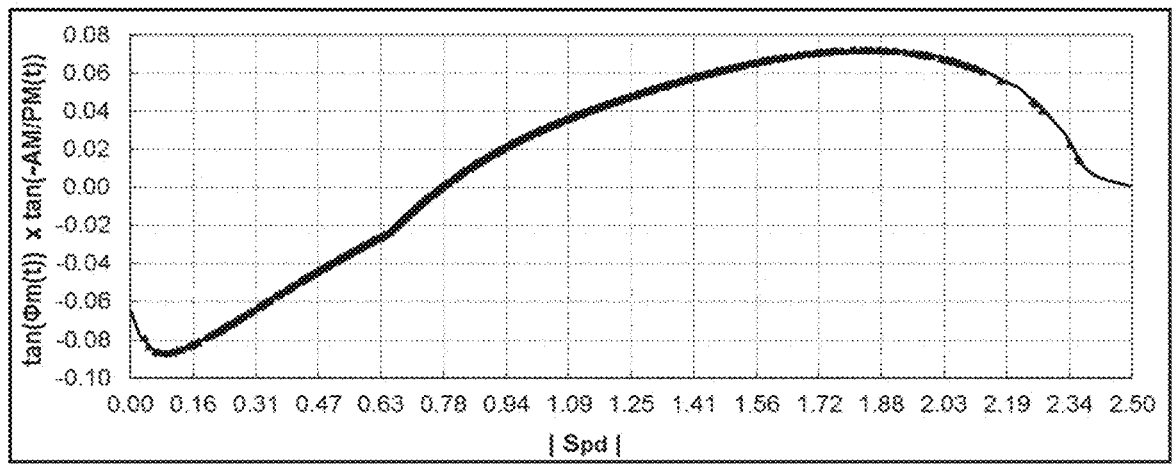
FIG. 7 is a diagram showing a result of calculating $\tan(\varphi_m(t))\times\tan(-AM/PM(t))$ according to the amplitude $|S_{pd}(t)|$ of the input signal of the signal separation unit in a process of obtaining the deviation compensation coefficient according to the embodiment of the present disclosure.

FIG. 7 shows a result of calculating $\tan(\varphi_m(t)) \times \tan(-AM/PM(t))$ according to the amplitude $S_{pd}(t)$ of the input signal $S_{pd}(t)$ of the signal separation unit 2 in accordance with the above procedure.

Next, the compensation coefficient calculation unit 11 calculates, from $\tan(\varphi_m(t)) \times \tan(-AM/PM(t))$ according to the amplitude $|S_{pd}(t)|$ of the input signal $S_{pd}(t)$ of the signal separation unit 2 calculated in Step S2, the coefficient $k(t)=|S'_{C1}(t)|/|S'_{C2}(t)|$ which represents a ratio of $|S'_{C2}(t)|$ to $|S'_{C1}(t)|$ to be compensated according to the amplitude $|S_{pd}(t)|$ of the input signal $S_{pd}(t)$ of the signal separation unit 2 based on the above Formula (16) (Step S3).

Figure 8:
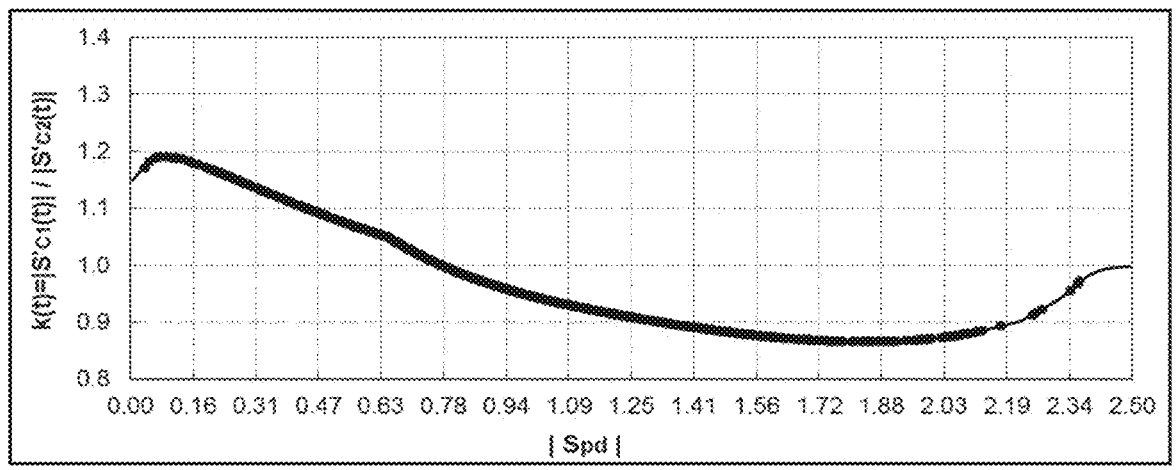
FIG. 8 is a diagram showing a result of calculating a coefficient $k(t)=|S'_{C1}(t)|/|S'_{C2}(t)|$ according to the amplitude $|S_{pd}(t)|$ of the input signal of the signal separation unit in the process of calculating the deviation compensation coefficient according to the embodiment of the present disclosure.

FIG. 8 shows a result of calculating the coefficient $k(t)=|S'_{C1}(t)|/|S'_{C2}(t)|$ according to the amplitude $|S_{pd}(t)|$ of the input signal of the signal separation unit 2 in accordance with the above procedure.

Next, the compensation coefficient calculation unit 11 calculates, from the coefficient $k(t)=|S'_{C1}(t)|/|S'_{C2}(t)|$ calculated in Step S3, respective deviation compensation coefficients of $|S'_{C1}(t)|$ and $|S'_{C2}(t)|$ according to the amplitude $|S_{pd}(t)|$ of the input signal of the signal separation unit 2 (Step S4).

The coefficient $k(t)$ is a coefficient representing the ratio of $|S'_{C1}(t)|$ to be compensated to $|S'_{C2}(t)|$. Thus, when $k(t)$ is greater than 1, $|S'_{C1}(t)|$ is increased by $k(t)$ times (>1) or $|S'_{C2}(t)|$ is reduced by $1/k(t)$ times (<1), the inter-branch amplitude imbalance (deviation) between the amplitudes $|S'_1(t)|$ and $|-S'_2(t)|$ of the input signals $S'_1(t)$ and $-S'_2(t)$ of the combining unit 7 can be compensated. On the contrary, when $k(t)$ is smaller than 1, $|S'_{C1}(t)|$ is reduced by $k(t)$ times (<1) or $|S'_{C2}(t)|$ is increased by $1/k(t)$ times (<1), the inter-branch amplitude imbalance (deviation) between the amplitudes $|S'_1(t)|$ and $|-S'_2(t)|$ of the input signals $S'_1(t)$ and $-S'_2(t)$ of the combining unit 7 can be compensated.

The outphasing amplifier using the Chireix combiner (combining unit 7) differs from the above-mentioned LINC system that uses a hybrid or 3 dB coupler or the like as the combining unit. An object of the outphasing amplifier using the Chireix combiner (combining unit 7) is to modulate a signal so that the amplitude thereof becomes small according to the phase control amount ($\pm(90-\varphi_m(t))$ deg; 0 deg$\leq\varphi_m(t)\leq$90 deg), i.e., according to an increase in the deflection angle from the in-phase, so as to improve power efficiency. Thus, the outphasing amplifier using the Chireix combiner (combining unit 7) makes a compensation in such a way to reduce $|S'_1(t)|=|-S'_2(t)|$ after the inter-branch amplitude imbalance (deviation) between the input signals $S'_1(t)$ and $-S'_2(t)$ of the combining unit 7 is compensated. Hereinafter, an example of the compensation in which when $k(t)$ is greater than 1, $|S'_{C2}(t)|$ is reduced by $1/k(t)$ times (<1), while when $k(t)$ is smaller than 1, $|S'_{C1}(t)|$ is reduced by $k(t)$ times (<1).

Figure 9:
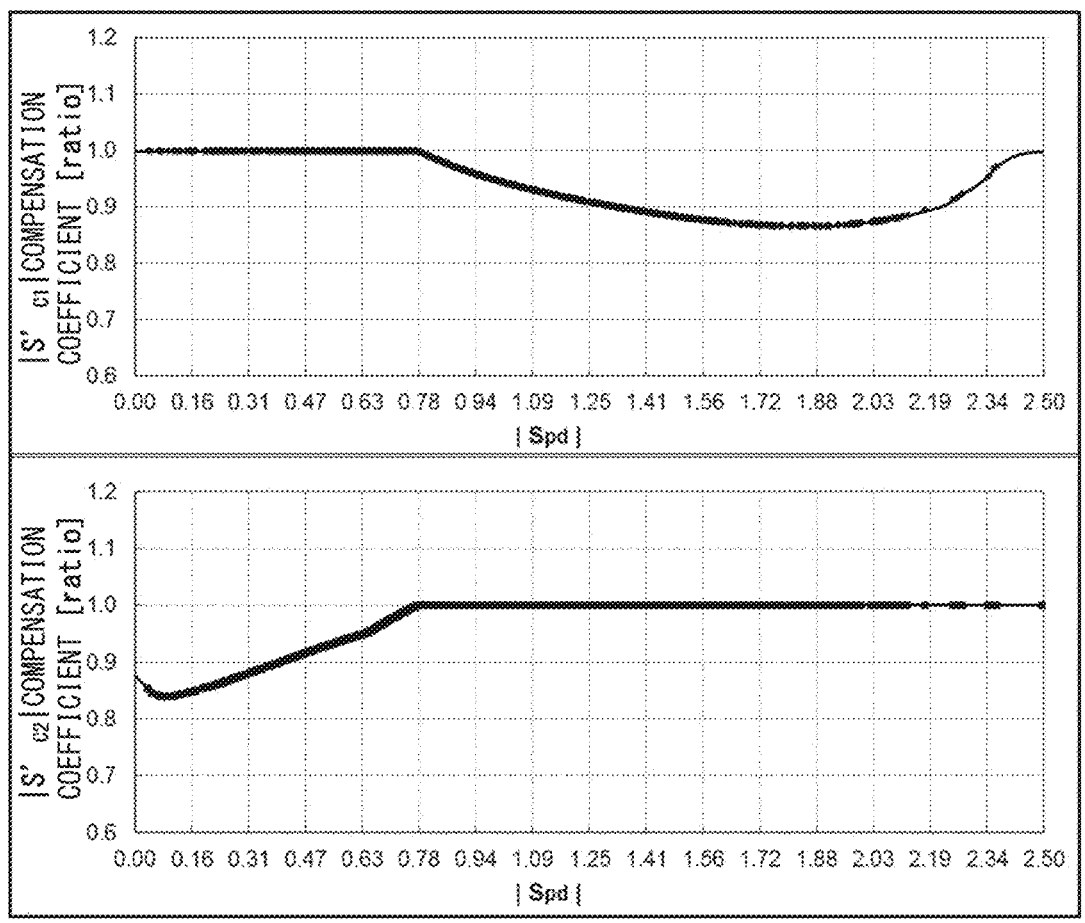
FIG. 9 is a diagram showing deviation compensation coefficients of $|S'_{C1}(t)|$ and $|S'_{C2}(t)|$ according to the amplitude $|S_{pd}(t)|$ of the input signal of the signal separation unit calculated from the coefficient $k(t)$ shown in FIG. 8 according to the embodiment of the present disclosure.

FIG. 9 shows the deviation compensation coefficients of $|S'_{C1}(t)|$ and $|S'_{C2}(t)|$ according to the amplitude $|S_{pd}(t)|$ of the input signal $S_{pd}(t)$ of the signal separation unit 2 calculated, in the compensation coefficient calculation unit 11 according to this embodiment, from the coefficient $k(t)=|S'_{C1}(t)|/|S'_{C2}(t)|$ according to the amplitude $|S_{pd}(t)|$ of the input signal $S_{pd}(t)$ of the signal separation unit 2 shown in FIG. 8.

In the above descriptions, although the deviation compensation coefficient of $|S'_{C1}(t)|$ and the deviation compensation coefficient of $|S'_{C2}(t)|$ are shown for the convenience of descriptions (for the distinction between the deviation compensation coefficients), they are nothing but the deviation compensation coefficient for $S_{C1}(t)$ and the deviation compensation coefficient for $S_{C2}(t)$, respectively, from the signal separation unit 2.

After that, the compensation coefficient calculation unit 11 stores, in the LUT 14a in the deviation compensation unit 12a shown in FIG. 2, the deviation compensation coefficient of $|S'_{C1}(t)|$ calculated in Step S4 as the deviation compensation coefficient for $S_{C1}(t)$ according to the amplitude $|S_{pd}(t)|$ of the input signal $S_{pd}(t)$ of the signal separation unit 2 shown in FIG. 9, and updates the LUT 14a. Likewise, the compensation coefficient calculation unit 11 stores, in the LUT 14b in the deviation compensation unit 12b shown in FIG. 2, the deviation compensation coefficient of $|S'_{C2}(t)|$ calculated in Step S4 as the deviation compensation coefficient for $S_{C2}(t)$ according to the amplitude $|S_{pd}(t)|$ of the input signal $S_{pd}(t)$ of the signal separation unit 2 shown in FIG. 9, and updates the LUT 14b.

As described in the description of FIG. 2, the deviation compensation unit 12a acquires the deviation compensation coefficient corresponding to $|S_{pd}(t)|$ from the LUT 14a based on the amplitude information of $|S_{pd}(t)|$ from the signal separation unit 2, and the multiplication unit 13a multiplies the acquired deviation compensation coefficient by the output signal $S_{C1}(t)$ from the signal separation unit 2, and outputs the multiplied signal. Likewise, the deviation compensation unit 12b acquires the deviation compensation coefficient corresponding to $|S_{pd}(t)|$ from the LUT 14b based on the amplitude information of $|S_{pd}(t)|$ from the signal separation unit 2, and the multiplication unit 13b multiplies the acquired deviation compensation coefficient by the output signal $S_{C2}(t)$ from the signal separation unit 2, and outputs the multiplied signal.

Another means of calculating each deviation compensation coefficient from the coefficient $k(t)$ may be a calculation process for increasing $|S'_{C1}(t)|$ by $k(t)$ times (>1) when $k(t)$ is greater than 1 and increasing $|S'_{C2}(t)|$ by $1/k(t)$ times (>1) when $k(t)$ is smaller than 1. Such a calculation process can also compensate the inter-branch amplitude imbalance (deviation) as a matter of course.

As in the related art shown in Patent Literature 1 and 3, when the inverse characteristic of the inter-branch amplitude imbalance (deviation) is used as a model function of a polynomial, and the coefficients of the polynomial are sequentially updated so as to reduce an error, a plurality of calculations are necessary to converge the coefficients. On the other hand, the method of calculating the deviation compensation coefficient according to this embodiment shown in FIG. 5 can calculate a convergence value of the deviation compensation coefficient for compensating the inter-branch amplitude imbalance (deviation) by one calculation using the AM/AM non-linearity characteristic and the AM/PM non-linearity characteristic of the entire apparatus.

Effect of Embodiment

Figure 10:
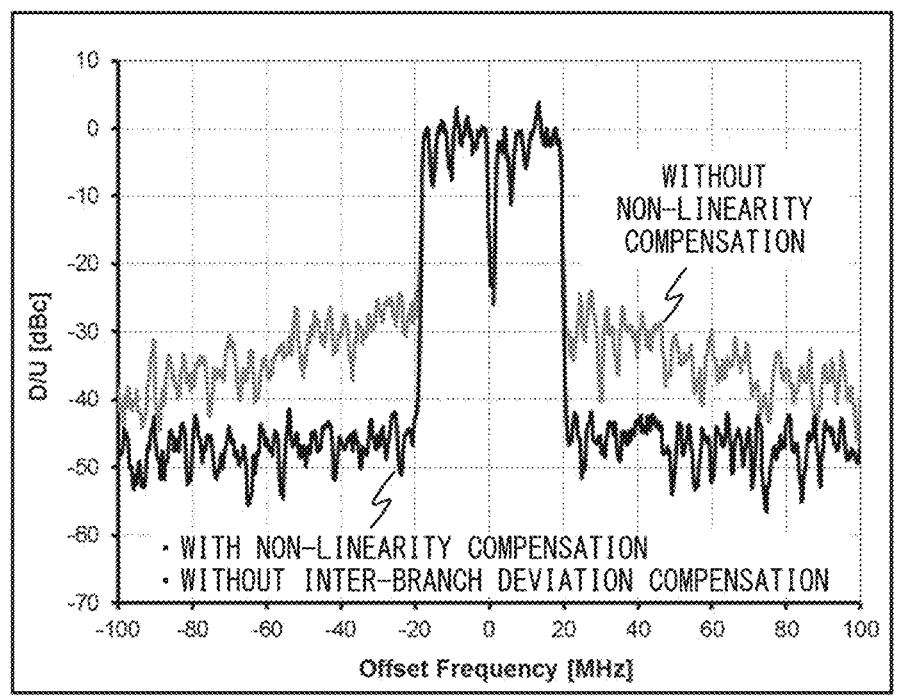
FIG. 10 shows a comparison between a spectrum when the AM/AM non-linearity characteristic and the AM/PM non-linearity characteristic shown in FIG. 19 are not compensated and a spectrum when only non-linearity of the entire outphasing amplification apparatus is compensated by a compensation method according to the related art while the inter-branch amplitude imbalance (deviation) is not compensated.

FIG. 10 shows a comparison between a spectrum when the AM/AM non-linearity characteristic and the AM/PM non-linearity characteristic shown in FIG. 19 are not compensated and a spectrum when only the non-linearity of the entire outphasing amplification apparatus is compensated by the compensation method according to the related art while the inter-branch amplitude imbalance (deviation) is not compensated.

Figure 11:
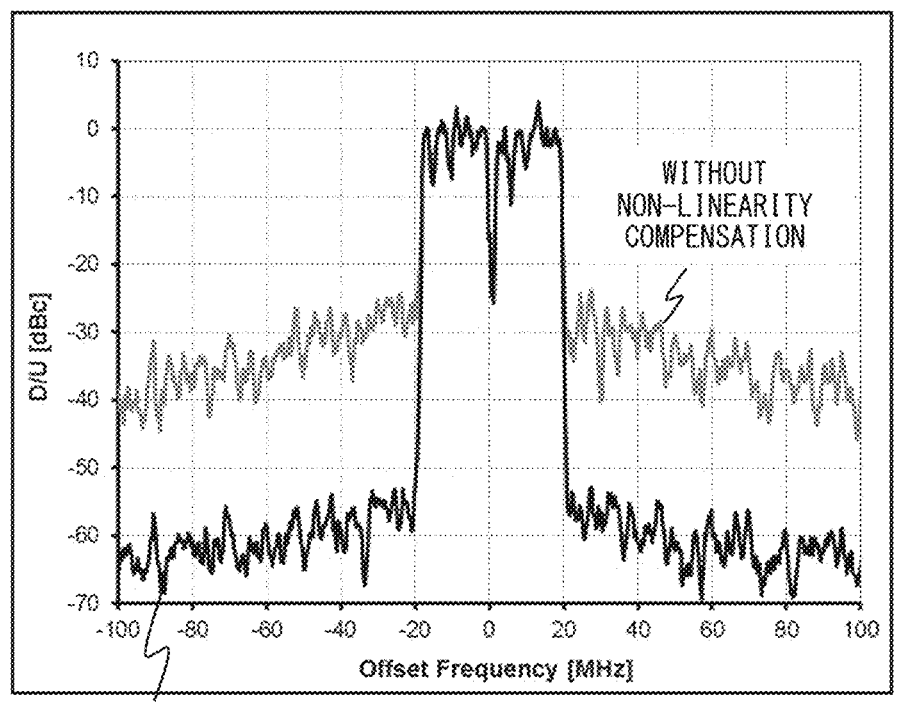
FIG. 11 shows a comparison between a spectrum when the AM/AM non-linearity characteristic and the AM/PM non-linearity characteristic shown in FIG. 19 are not compensated and a spectrum when the non-linearity of the entire outphasing amplification apparatus and the inter-branch amplitude imbalance (deviation) are compensated by a compensation method according to the embodiment of the present disclosure.

FIG. 11 shows a comparison between a spectrum when the AM/AM non-linearity characteristic and the AM/PM non-linearity characteristic shown in FIG. 19 are not compensated and a spectrum when the non-linearity of the entire outphasing amplification apparatus and the inter-branch amplitude imbalance (deviation) are compensated by the compensation method according to this embodiment.

As shown in FIG. 10, although the distortion can be controlled only by the non-linearity compensation of the entire outphasing amplification apparatus as compared with the case without the non-linearity compensation, the D/U ratio (Desire to Undesire Ratio) is only about 45 dBc. On the other hand, as shown in FIG. 11, when both of the inter-branch amplitude imbalance (deviation) and the non-linearity of the entire outphasing amplification apparatus are compensated by the compensation method according to this embodiment, the AM/AM non-linearity characteristic and the AM/PM non-linearity characteristic can be compensated up to 55 dBc or more of the D/U ratio of the distortion.

In addition, the problem that the dynamic range of the amplitude (output power) of the outphasing combined signal becomes narrow due to the inter-branch amplitude imbalance (deviation) when the Chireix combiner (combining unit 7) is used can be solved by achieving compensation of the inter-branch amplitude imbalance (deviation).

The outphasing amplification apparatus according to this embodiment described above calculates the non-linearity compensation coefficient for compensating the non-linearity of the entire apparatus and the respective deviation compensation coefficients for compensating the inter-branch amplitude imbalance (deviation) using, for compensation calculation, the input baseband signal $S_{in}(t)$ and the combined outphasing combined signal $S_{out}(t)$ in the process of the non-linearity compensation process for the entire apparatus according to the related art with a small circuit configuration that observes only the input baseband signal $S_{in}(t)$ input to the outphasing amplification apparatus and the combined outphasing combined signal $S_{out}(t)$ output from the outphasing amplification apparatus. Therefore, both the non-linearity compensation of the entire outphasing amplification apparatus and the inter-branch amplitude imbalance (deviation) compensation can be achieved with a small circuit configuration and with a significant reduction in the amount of calculation processing.

Although the various viewpoints of the present disclosure have been demonstrated with reference to the embodiment, the present disclosure is not limited by the above. Various modifications that can be understood by those skilled in the art can be made to the configurations and details in each aspect of the present disclosure.

The present application is based upon and claims the benefit of priority from Japanese Patent Application No. 2017-053943, filed on Mar. 21, 2017, the entire contents of which are hereby incorporated by reference.

REFERENCE SIGNS LIST

1 NON-LINEARITY COMPENSATION UNIT
2 SIGNAL SEPARATION UNIT
3a DAC+Filter (DIGITAL-TO-ANALOG CONVERTER AND FILTER)
3b DAC+Filter (DIGITAL-TO-ANALOG CONVERTER AND FILTER)
4a QUADRATURE MODULATOR
4b QUADRATURE MODULATOR
5a FREQUENCY CONVERTER
5b FREQUENCY CONVERTER
6a FIRST AMPLIFIER (AMPLIFIER A)
6b SECOND AMPLIFIER (AMPLIFIER B)
7 COMBINING UNIT
8 FREQUENCY CONVERTER
9 QUADRATURE DEMODULATOR
10 Filter+ADC (FILTER DIGITAL-TO-ANALOG CONVERTER)
11 COMPENSATION COEFFICIENT CALCULATION UNIT
12a DEVIATION COMPENSATION UNIT
12b DEVIATION COMPENSATION UNIT
13a MULTIPLICATION UNIT
13b MULTIPLICATION UNIT
14a LUT (LOOKUP TABLE)
14b LUT (LOOKUP TABLE)

The invention claimed is:

1. An amplification apparatus comprising:
a first amplifier provided in a first branch;
a second amplifier provided in a second branch;
a signal separation unit configured to perform phase modulation on an input baseband signal input to the amplification apparatus according to an amplitude of the input baseband signal to thereby separate the input baseband signal into a pair of phase modulated signals of a constant amplitude, output one of the pair of the phase modulated signals to the first branch as a first branch signal, and output the other one of the pair of the phase modulated signals to the second branch as a second branch signal;
a combining unit configured to combine an output signal of the first amplifier with an output signal of the second amplifier and output the combined signal from the amplification apparatus;
a non-linearity compensation unit provided at an input stage of the signal separation unit and configured to multiply the input baseband signal by a non-linearity compensation coefficient for compensating non-linearity of the entire amplification apparatus;
a first deviation compensation unit provided at an output stage of the signal separation unit and configured to multiply the first branch signal by a first deviation compensation coefficient for compensating a deviation between the first branch and the second branch;
a second deviation compensation unit provided at the output stage of the signal separation unit and configured to multiply the second branch signal by a second deviation compensation coefficient for compensating the deviation between the first branch and the second branch; and
a compensation coefficient calculation unit configured to calculate the non-linearity compensation coefficient, the first deviation compensation coefficient, and the second deviation compensation coefficient based on the input baseband signal and a feedback baseband signal obtained by feeding back the combined signal.

2. The complication apparatus according to claim 1, wherein
the compensation coefficient calculation unit calculates the first deviation compensation coefficient and the second deviation compensation coefficient for compensating a deviation between the first branch and the second branch so as to cancel a phase difference between an input signal of the signal separation unit and the feedback baseband signal.

3. The amplification apparatus according to claim 1, wherein the compensation coefficient calculation unit
observes the input baseband signal and the feedback baseband signal after the non-linearity of the entire amplification apparatus is compensated by the non-linearity compensation unit,
calculates a specific coefficient representing an amplitude ratio between an output signal of the first deviation compensation unit and an output signal of the second deviation compensation unit according to an amplitude of the input signal of the signal separation unit based on the input baseband signal and the feedback baseband signal, and
calculates the first deviation compensation coefficient and the second deviation compensation coefficient based on the specific coefficient according to the amplitude of the input signal of the signal separation unit.

4. The amplification apparatus according to claim 3, wherein the compensation coefficient calculation unit
observes an AM/PM non-linearity characteristic representing a phase difference between the combined signal and the input baseband signal according to the amplitude of the input baseband signal,
observes an AM/AM non-linearity characteristic representing an amplitude ratio of the combined signal to the input baseband signal according to the amplitude of the input baseband signal,
converts the AM/PM non-linearity characteristic according to the amplitude of the input baseband signal into a reciprocal of the AM/PM non-linearity characteristic according to the amplitude of the input signal of the signal separation unit based on a reciprocal of the AM/AM non-linearity characteristic according to the amplitude of the input baseband signal,
calculates a product of a tangent of the reciprocal of the AM/PM non-linearity characteristic according to the amplitude of the input signal of the signal separation unit and a tangent of a phase modulation angle according to the amplitude of the input signal of the signal separation unit, and
calculates the specific coefficient according to the amplitude of the input signal of the signal separation unit based on the product according to the amplitude of the input signal of the signal separation unit.

5. The amplification apparatus according to claim 3, wherein
the specific coefficient is a coefficient represented by k where an amplitude of the output signal of the first deviation compensation unit is a dividend and an amplitude of the output signal of the second deviation compensation unit is a divisor,
when the k is greater than 1, the compensation coefficient calculation unit calculates the first deviation compensation coefficient and the second deviation compensation coefficient so that the amplitude of the output signal of the second deviation compensation unit becomes 1/k times based on the k, and
when the k is smaller than one, the compensation coefficient calculation unit calculates the first deviation compensation coefficient and the second deviation compensation coefficient so that the amplitude of the output signal of the first deviation compensation unit becomes k times based on the k.

6. The amplification apparatus according to claim 1, wherein
the signal separation unit outputs amplitude information of the amplitude of the input signal of the signal separation unit to the first deviation compensation unit and the second deviation compensation unit,
the first deviation compensation unit includes a first lookup table in which the amplitude of the input signal of the signal separation unit is associated with the first deviation compensation coefficient, acquires the first deviation compensation coefficient corresponding to the amplitude of the input signal of the signal separation unit from the first lookup table based on the amplitude information output from the signal separation unit, and multiplies the first branch signal by the acquired first deviation compensation coefficient, and
the second deviation compensation unit includes a second lookup table in which the amplitude of the input signal of the signal separation unit is associated with the second deviation compensation coefficient, acquires the second deviation compensation coefficient corresponding to the amplitude of the input signal of the signal separation unit from the second lookup table based on the amplitude information output from the signal separation unit, and multiplies the second branch signal by the acquired second deviation compensation coefficient.

7. The amplification apparatus according to claim 6, wherein
when the compensation coefficient calculation unit calculates the first deviation compensation coefficient, it updates the first lookup table, and
when the compensation coefficient calculation unit calculates the second deviation compensation coefficient, it updates the second lookup table.

8. An amplification method performed by an amplification apparatus comprising:
multiplying an input baseband signal input to the amplification apparatus by a non-linearity compensation coefficient for compensating non-linearity of the entire amplification apparatus;
performing phase modulation on a signal obtained by multiplying the input baseband signal by the non-linearity compensation coefficient according to an amplitude of the input baseband signal to thereby separate the signal into a pair of phase modulated signals of a constant amplitude;
multiplying, at a first branch, a first branch signal, which is one of the pair of phase modulated signals, by a first deviation compensation coefficient for compensating a deviation between the first branch and a second branch, amplifying power by a first amplifier, and outputs the amplified signal;
multiplying, at the second branch, a second branch signal, which is another one of the pair of phase modulated signals, by a second deviation compensation coefficient for compensating the deviation between the first branch and the second branch, amplifying power by a second amplifier, and outputs the amplified signal;

combining an output signal of the first amplifier with an output signal of the second amplifier and outputting the combined signal from the amplification apparatus; and calculating the non-linearity compensation coefficient, the first deviation compensation coefficient, and the second deviation compensation coefficient based on the input baseband signal and a feedback baseband signal obtained by feeding back the combined signal.

\* \* \* \* \*